United States Patent
Gotkis et al.

(10) Patent No.: US 7,309,618 B2
(45) Date of Patent: Dec. 18, 2007

(54) METHOD AND APPARATUS FOR REAL TIME METAL FILM THICKNESS MEASUREMENT

(75) Inventors: Yehiel Gotkis, Fremont, CA (US); Rodney Kistler, Los Gatos, CA (US); Aleksander Owczarz, San Jose, CA (US); David Hemker, San Jose, CA (US); Nicolas J. Bright, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 378 days.

(21) Appl. No.: 10/463,525

(22) Filed: Jun. 18, 2003

(65) Prior Publication Data

US 2004/0002171 A1 Jan. 1, 2004

Related U.S. Application Data

(63) Continuation-in-part of application No. 10/186,472, filed on Jun. 28, 2002, now Pat. No. 7,128,803.

(51) Int. Cl.
*H01L 21/00* (2006.01)

(52) U.S. Cl. .......................... 438/5; 438/14; 324/229; 156/345.13

(58) Field of Classification Search .................. 438/5, 438/10, 14, 17; 156/345.1, 345.12, 345.13, 156/345.31, 345.32; 324/229, 230
See application file for complete search history.

(56) References Cited

U.S. PATENT DOCUMENTS

| | | | |
|---|---|---|---|
| 3,815,016 A | 6/1974 | Nix et al. ....................... | 324/34 |
| 4,850,157 A | 7/1989 | Holmstrand | |
| 5,240,552 A | 8/1993 | Yu et al. | |
| 5,473,247 A | 12/1995 | You et al. ..................... | 324/227 |
| 5,485,082 A | 1/1996 | Wisspeintner et al. ....... | 324/202 |
| 5,660,672 A | 8/1997 | Li et al. ...................... | 156/345 |
| 5,709,593 A | 1/1998 | Guthrie et al. | |
| 5,926,020 A | 7/1999 | Samson ....................... | 324/238 |
| 6,051,499 A | 4/2000 | Tolles et al. | |
| 6,132,289 A | 10/2000 | Labunsky et al. | |
| 6,165,057 A | 12/2000 | Gill, Jr. | |

(Continued)

FOREIGN PATENT DOCUMENTS

DE 42 27 735 A1 2/1994

(Continued)

*Primary Examiner*—Kevin M. Picardat
(74) *Attorney, Agent, or Firm*—Martine Penilla & Gencarella, LLP

(57) ABSTRACT

A semiconductor processing system is provided. The semiconductor processing system includes a first sensor configured to isolate and measure a film thickness signal portion for a wafer having a film disposed over a substrate. A second sensor is configured to detect a film thickness dependent signal in situ during processing, i.e. under real process conditions and in real time. A controller configured to receive a signal from the first sensor and a signal from the second sensor. The controller is capable of determining a calibration coefficient from data represented by the signal from the first sensor. The controller is capable of applying the calibration coefficient to the data associated with the second sensor, wherein the calibration coefficient substantially eliminates inaccuracies introduced to the film thickness dependent signal from the substrate. A method for calibrating an eddy current sensor is also provided.

16 Claims, 21 Drawing Sheets

U.S. PATENT DOCUMENTS

| | | |
|---|---|---|
| 6,265,870 B1 | 7/2001 | Weischedel ................. 324/240 |
| 6,291,992 B1 | 9/2001 | Van Andel et al. ......... 324/240 |
| 6,338,667 B2 | 1/2002 | Sandhu et al. |
| 6,350,179 B2 * | 2/2002 | Campbell et al. ............. 451/41 |
| 6,387,807 B1 | 5/2002 | Faubert et al. |
| 6,396,158 B1 | 5/2002 | Travis et al. |
| 6,563,308 B2 * | 5/2003 | Nagano et al. ............. 324/230 |
| 6,707,540 B1 | 3/2004 | Lehman et al. |
| 6,722,943 B2 | 4/2004 | Joslyn |
| 6,808,590 B1 | 10/2004 | Gotkis et al. |

| | | |
|---|---|---|
| 2001/0001755 A1 | 5/2001 | Sandhu et al. |
| 2002/0192966 A1 | 12/2002 | Shanmugasundram et al. |
| 2003/0066200 A1 | 4/2003 | Hellstrom |

FOREIGN PATENT DOCUMENTS

| | | | |
|---|---|---|---|
| EP | 0 370 691 | 5/1990 | ................. 27/90 |
| EP | 0 459 441 | 5/1991 | ................. 27/90 |
| EP | 0 763 402 | 3/1997 | |
| GB | 1 452 417 | 10/1976 | |
| WO | WO91/15733 | 10/1991 | |

* cited by examiner

METHOD AND APPARATUS FOR REAL TIME METAL FILM THICKNESS MEASUREMENT

CROSS REFERENCE TO RELATED APPLICATION

This application is continuation-in-part of U.S. patent application Ser. No. 10/186,472, entitled "INTEGRATION OF EDDY CURRENT SENSOR BASED METROLOGY WITH SEMICONDUCTOR FABRICATION TOOLS," filed on Jun. 28, 2002. This application is related to U.S. patent application Ser. No. 10/186,932,entitled "METHOD AND APPARATUS OF ARRAYED SENSORS FOR METROLOGICAL CONTROL," filed on Jun. 28, 2002 and U.S. patent application Ser. No. 10/256,055, entitled "ENHANCEMENT OF EDDY CURRENT BASED MAESUREMENT CAPABILITIES," filed on Sep. 25, 2002. This application is related to U.S. patent application Ser. No. 10/463,526, entitled "METHOD AND APPARATUS FOR APPLYING DIFFERENTIAL REMOVAL RATES TO A SURFACE OF A SUBSTRATE," filed on the same day as the current application. The disclosure of each of these above related applications are incorporated herein by reference for all purposes.

BACKGROUND OF THE INVENTION

The invention relates generally to semiconductor fabrication and more specifically to in-line metrology for process control during wafer processing.

During semiconductor fabrication there are many opportunities for measuring features of substrates undergoing processing operations. Many of the features can be determined by capturing a signal indicating the feature. For example, various end point determination methods are available that employ laser interferometry, optical emission, etc. However, as the features continue to decrease in size, especially the thickness of films employed in the manufacture of semiconductors, the signals that are indicative of the feature become undetectable in certain situations. For example, eddy current sensors are used for displacement, proximity and film thickness measurements. The sensors rely on the induction of current in a sample by the fluctuating electromagnetic field of a test coil proximate to the object being measured. Fluctuating electromagnetic fields are created as a result of passing an alternating current through the coil. The fluctuating electromagnetic fields induce eddy currents which perturb the applied field and change the coils inductance.

FIG. 1 is a simplified schematic diagram of the principle upon which an eddy current sensor operates. An alternating current flows through coil 100 in close proximity to conducting object 102. The electromagnetic field of the coil induces eddy currents 104 in conducting object 102. The magnitude and the phase of the eddy currents in turn effect the loading on the coil. Thus, the impedance of the coil is impacted by the eddy currents. This impact is measured to sense the proximity of conducting object 102 as well as a thickness of the object. Distance 106 impacts the effect of eddy currents 104 on coil 100, therefore, if object 102 moves, the signal from the sensor monitoring the impact of eddy currents on coil 100 will also change.

Attempts to use eddy current sensors to measure thickness of a film has resulted in limited success. Since the signal from the eddy current sensor is sensitive to both the thickness of the film and distance of the substrate to the sensor, there are two unknowns that must be resolved. FIG. 2A is a schematic diagram of a wafer carrier having an eddy current sensor for measuring the thickness of a wafer during a chemical mechanical planarization process (CMP). Wafer carrier 108 includes eddy current sensor 110. During a CMP operation, wafer 114 supported by carrier film 112 of carrier 108 is pressed against pad 116 to planarize a surface of the wafer. Pad 116 is supported by stainless steel backing 118.

One shortcoming of the configuration of FIG. 2A comes from the variability of the carrier film, which, being only 0.020" thick can undergo variations up to 0.006" from sample to sample. Process conditions, in particular, film compression due to wafer load, affect the sensor-metal layer distance. Thus, the carrier film and variable process conditions cause a substantial variability in the distance between the wafer and the sensor. Accordingly, it becomes extremely difficult to calibrate for all the variables that effect the distance, which in turn impacts the thickness measurement of the sensor. Another shortcoming of this configuration is caused by the presence of another conducting material separate from the conducting material being measured and is commonly referred to as a third body effect. If the thickness of the conductive layer is less than the so-called skin depth, the electromagnetic field from the coil will not be completely absorbed and will partially pass through to stainless steel backing 118 of pad 116 of FIG. 2A. The electromagnetic field will induce additional eddy currents within the stainless steel belt, thereby contributing to the total signal from the eddy current sensor.

Furthermore, it should be appreciated that the pad wears or erodes over time, causing variation in the distance between the stainless steel backing and the eddy current sensor, which influences the appropriated contribution to the total eddy current sensor signal. Thus, a wear factor has to be considered as the wafers are continuously being processed. Consequently, due to the variability injected into the thickness measurement, the amount of error is unacceptably high and unpredictable. Furthermore, the focus on uniformity of removal rates is misguided for current applications. That is, from the end user's perspective, it is desired to have a uniform end layer on the surface of the semiconductor substrate which is not necessarily the result from a uniform removal rate. For example, if the surface of the processed wafer prior to planarization is not uniformly thick, the non-uniformities are maintained when a uniform removal rate is applied to the processed wafer.

FIG. 2B is a simplified cross sectional schematic diagram illustrating the results of applying a uniform removal rate to a surface of a silicon substrate. As can be seen, a uniform removal rate applied to substrate 109 results in substrate 11 having a non uniform thickness, i.e., the thickness at the center of substrate II is smaller than the thickness at the outer edge of the substrate, which is similar to substrate 109 prior to the planarization application. As a result, the center of substrate 111 may be over-polished especially with respect to a copper clearing process.

Additionally, some systems that are sensitive enough to accommodate the low film thickness required for semiconductor processing may have their sensing signals interfered with from third bodies. For example, the signal may be impacted by the presence of other conductive objects within the sensing vicinity. Furthermore, the impact may not be constant, but dependent on the metal film thickness, thereby making direct signal-to-thickness conversion impossible.

In view of the foregoing, there is a need to provide a method and apparatus that may deliver a uniform thickness rather than a uniform removal rate to provide control over the uniformity of the targeted remaining layer thickness for the wafer. In addition, there is a need to provide real time differential closed loop control for the remaining thickness of a semiconductor wafer being processed.

SUMMARY OF THE INVENTION

Broadly speaking, the present invention fills these needs by providing a system capable of excluding effects from third bodies, in real time to correctly measure the thickness of a process film, and differentially controlling a removal rate in order to provide a more uniform planarized surface following a CMP operation. It should be appreciated that the present invention can be implemented in numerous ways, including as an apparatus, a system, a device, or a method. Several inventive embodiments of the present invention are described below.

In accordance with one embodiment of the present invention, a semiconductor processing system is provided. The semiconductor processing system includes a first sensor configured to isolate and measure a film thickness signal portion for a wafer having a film disposed over a substrate. A second sensor is configured to detect a film thickness dependent signal in situ during processing, i.e. under real process conditions and in real time. A controller configured to receive a signal from the first sensor and a signal from the second sensor. The controller is capable of determining a calibration coefficient from data represented by the signal from the first sensor. The controller is capable of applying the calibration coefficient to the data associated with the second sensor, wherein the calibration coefficient substantially eliminates inaccuracies introduced to the film thickness dependent signal from the substrate.

In another embodiment, a metrological monitoring system configured to provide real-time thickness data with minimal inaccuracies is provided. The system includes a first group of sensors configured to generate data representing a thickness map associated with a wafer located within a detection region of the first group of sensors. The thickness map is generated prior to a processing operation. A second group of sensors configured to detect a thickness at a location on the wafer corresponding to one of the second group of sensors during a processing operation is included. A computing device in communication with the first group of sensors and the second group of sensors is provided. The computing device is enabled to remove inaccuracies introduced into the thickness data at the location from a conductive body through the application of a calibration coefficient determined from the data representing the thickness map.

In accordance with yet another embodiment of the present invention, a method for calibrating an eddy current sensor to substantially eliminate inaccuracies introduced by the presence of third bodies within a detection region of the eddy current sensor is provided. The method initiates with scanning a surface of a wafer in ideal conditions, i.e., in the absence of third bodies. Than, a calibration coefficient is generated from data captured by the scanning operation. Next, the wafer is transferred to a processing station. Then, a signal indicating a thickness of the wafer is detected in the presence of third bodies. Next, the calibration coefficient is applied to the signal to remove inaccuracies caused by the third bodies.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

Figure 1:
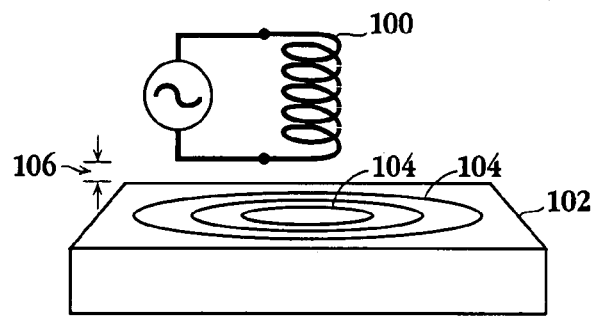
FIG. 1 is a simplified schematic diagram of the principle upon which an eddy current sensor operates.
Figure 2A:
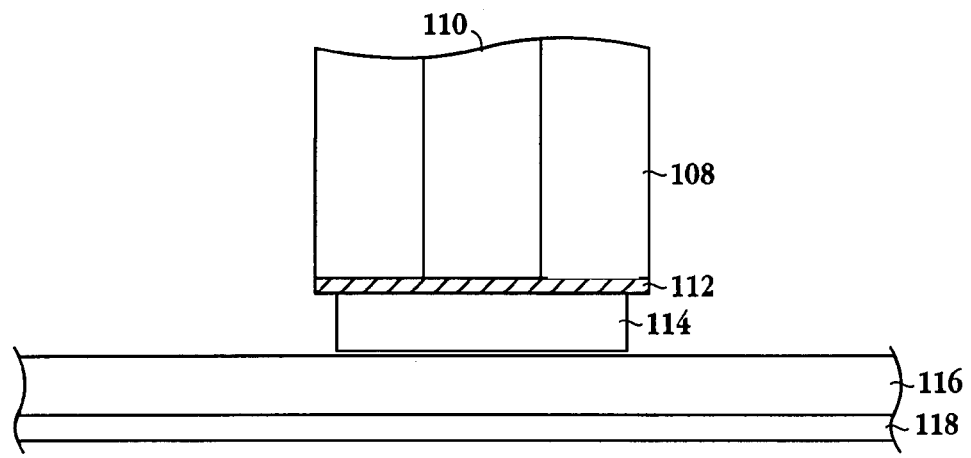
FIG. 2A is a schematic diagram of a wafer carrier having an eddy current sensor for measuring the thickness of a wafer during chemical mechanical planarization (CMP).
Figure 2B:
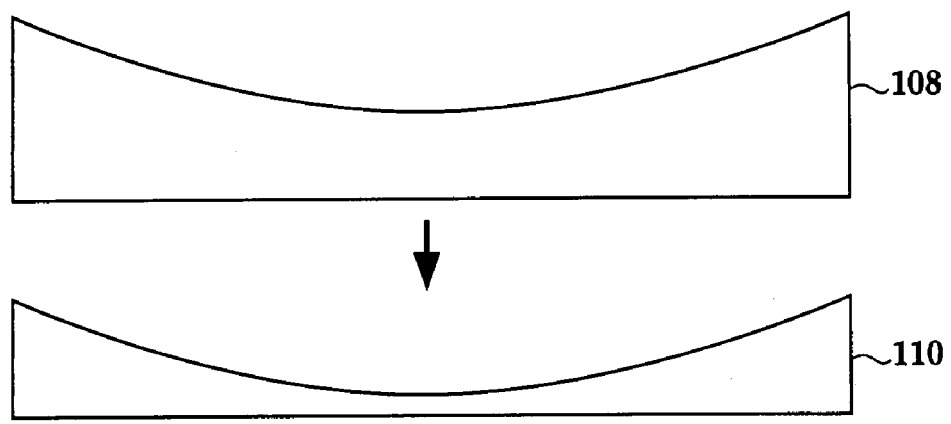
FIG. 2B is a simplified cross sectional schematic diagram illustrating the results of applying a uniform removal rate to a surface of a silicon substrate.

Several exemplary embodiments of the invention will now be described in detail with reference to the accompanying drawings. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention. FIGS. 1, 2A and 2B are discussed above in the "Background of the Invention" section.

Eddy current sensors (ECS) allow for the contactless measuring of a thin metal film thickness in the full range of thicknesses normally utilized in semiconductor manufacturing. It has been determined that ECS are capable of providing a fast enough response for a wafer moving under typical loading robotics velocity. Therefore, it is possible to perform the thickness measurements "on the fly" without impacting process throughput. Moreover, the movement of the wafer can be taken advantage of to produce a thickness profile from a limited number of sensors in a cluster configuration. For example, wafer aligners provide movement in a rotational direction and a linear radial direction. Accordingly, a cluster of sensors can capture a thickness profile of a wafer while the wafer is undergoing common automated wafer handling schemes. In one embodiment, a thickness profile can be generated for each wafer so that a recipe of a downstream process can be optimized for the thickness profile.

The Figures below initially provide configurations for an incoming sensor or sensor cluster that measures the thin film thickness-dependent signal from a wafer under ideal non-disturbing conditions, e.g., non-process conditions. This thickness can then be stored and/or communicated to downstream fabrication processes dealing with thin metal films. That is, the incoming thickness can be supplied to a similar thickness measuring device for the downstream fabrication process. The sensor associated with the downstream fabrication process can then be calibrated with the incoming thickness to make the unknowns or variables resulting from the processing conditions irrelevant. It should be appreciated that a cluster of sensors refers to the combination of two or three sensors to define a new metrological property. In one embodiment, the sensors are joined into clusters to remove sensitivity to distance. Sample results of data gathered with the sensor configurations are also provided herein. An array of sensors as used herein includes two or more clusters of sensors joined to cover, i.e., map, a larger area of a wafer. Additionally, three sensors located on the same side of a wafer can be considered an array.

When integrating the clustered sensor with a pre-existing station the thickness of the wafer can be mapped and stored for a downstream processing operation. In addition, when the wafers are removed from the processing chamber the thickness of the processed wafer can also be scanned to provide quality control feedback as to the results of the processing operation. Accordingly, adjustments can be made to the recipe of the operation based on the feedback. Of course, the post processing results can be provided for further processing operations also.

In one embodiment, a CMP system that includes differential closed loop control for a remaining thickness of a wafer is provided. The system includes a wafer carrier disposed over a polishing pad. The wafer carrier is configured to support a wafer during a planarization process. The wafer carrier includes a sensor configured to detect a signal indicating a thickness of the film. The signal indicating the thickness of the film includes third body effects. A general purpose computer in communication with the sensor is included. The general purpose computer is configured to adjust the signal indicating the thickness of the film from the sensor to substantially remove both third body effects introduced by the CMP system and a substrate thickness component. The substrate thickness component is determined prior to a processing operation in the absence of third bodies which may interfere with the signal, e.g., an eddy current signal. A slurry delivery system configured to provide a substantially uniform slurry layer onto the polishing pad is provided. The slurry delivery system includes a fluid restraining device having a first side and a second side. The fluid restraining device is configured to create a slurry pool over the polishing pad behind the first side by impeding the flow of the slurry on the pad as the pad is moving. The fluid restraining device is further configured to provide a substantially uniform slurry layer over the polishing pad following the second side. Downstream from the fluid restraining device is a mechanism configured to create a slurry deficient region or a slurry augmented region in the uniform slurry layer to differentially control the removal rate.

Figure 3:
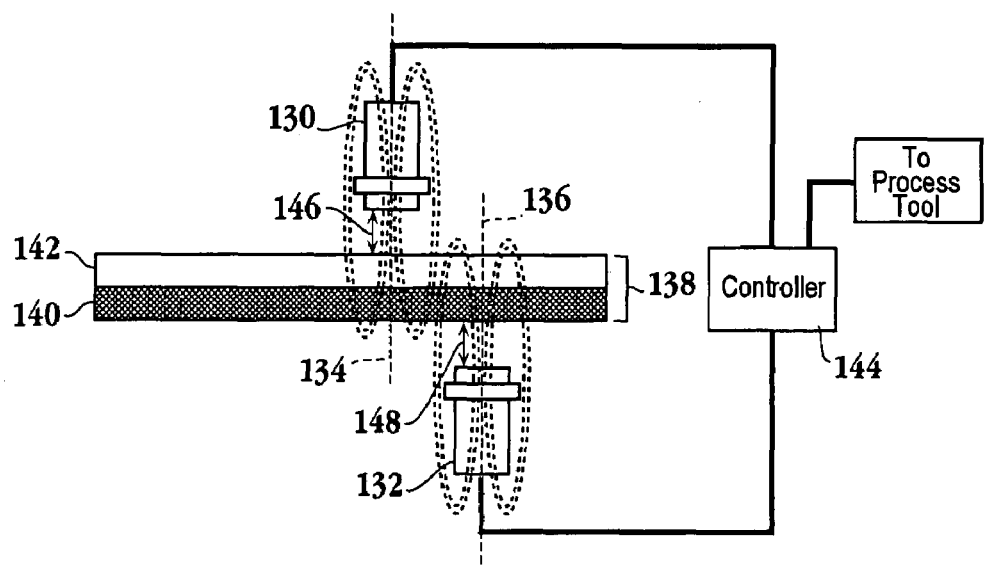
FIG. 3 is a simplified schematic diagram of coupled sensors for measuring thickness of an incoming wafer in accordance with one embodiment of the invention.

FIG. 3 is a simplified schematic diagram of coupled sensors for measuring thickness of an incoming wafer in accordance with one embodiment of the invention. Top sensor 130 and bottom sensor 132 are configured to provide a signal indicating a thickness of wafer 138. In one embodiment, sensors 130 and 132 are eddy current sensors. Wafer 138 includes substrate 142 and metal layer 140. Axis 134 of top sensor is offset from axis 136 of bottom sensor 132. One skilled in the art will appreciate that by offsetting top sensor 130 and bottom sensor 132, where both sensors are eddy current sensors, the electromagnetic field produced by sensors 130 and 132 will not interfere, i.e., suppress each other. Where the frequencies are the same and axis 134 is aligned with axis 136 then suppression of the signals can occur in certain situations, however, as will be explained below adjustments can be made to avoid suppression of the signals. Controller 144 is in communication with sensors 132 and 134. In one embodiment, controller 144 is configured to receive signals from sensors 132 and 134 and determine a thickness of wafer 138. It should be appreciated that controller 144 averages the signals from sensor 130 and 132 to arrive at a signal indicating a thickness of the wafer. Furthermore, by providing top sensor 130 and bottom sensor 132 a change in distance 146 between the top sensor and a top surface of wafer 138 or a change in distance 148 between the bottom sensor and a bottom surface of wafer 138 are cancelled out. That is, a change in either distance when both the sensors are stationary is offset by the averaging of the readings so that the signal is now a function of thickness rather than thickness and proximity. In another embodiment, controller 144 communicates the calculated thickness to a downstream tool, such as a CMP tool, so that the downstream process can optimize the process settings, such as pressure of the down force applied and belt speed, based upon the incoming thickness of the wafer.

Figure 4:
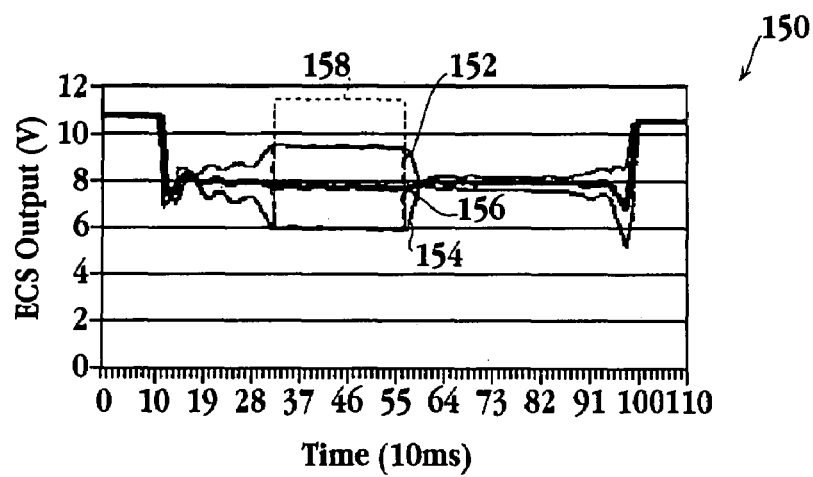
FIG. 4 is a graph of the signal of coupled eddy current sensors of FIG. 3.

FIG. 4 is a graph of the signal from coupled eddy current sensors configured as in FIG. 3 in accordance with one embodiment of the invention. Graph 150 plots an eddy current sensor output in volts versus time. Line 152 represents the signal from a sensor located below a wafer such as bottom sensor 132 of FIG. 3. Line 154 represents the signal from a sensor located above the wafer such as top sensor 130 of FIG. 3. Bold line 156 represents the average of lines 152 and 154. It will be apparent to one skilled in the art that line 156 provides a substantially constant signal. That is, by combining a signal from the top sensor with a signal from a bottom sensor, the dependence of the signal on the distance of the sensor is eliminated. For example, as wafer 138 of FIG. 3 moves closer to top sensor 130, the signal increases. Region 158 exemplifies the movement of the wafer closer to the top sensor. Thus, the signal intensity from the top sensor increases accordingly as illustrated by line 152 in region 158. At the same time, the wafer is moving away from the bottom sensor. Therefore, the signal intensity from the bottom sensor decreases similar to the increase of the signal intensity from the top sensor, as illustrated by line 154 in region 158. Consequently, an average of the top and bottom signal intensity stays constant. Since the signal intensity is linearly related to the distance of the sensor to the object, a change in signal intensity caused by movement of the object toward a first stationary sensor is offset by an opposite change in intensity caused by movement of the object away from a second stationary sensor. In turn, the sensitivity of the signal intensity to distance is eliminated, and the average signal, while being calibrated in terms of film thickness, provides distance independent thin film measurement capability.

Thus, by clustering a sensor or clusters of sensors with a sensor operating under working conditions, such as a sensor embedded in a wafer carrier of a CMP tool, the sensor operating under working conditions can be calibrated to more accurately provide information regarding the removal rate and process endpoint. That is, an accurate measurement of an incoming film thickness or wafer thickness is provided so that inaccuracies caused under processing conditions can be compensated through a calibration setting. Furthermore, the sensor cluster can be utilized as a run-to-run process control where a wafer has a thickness profile that is mapped by a first sensor or cluster of sensors and the profile is downloaded into a controller of the process tool to customize the process, such as a CMP process, to remove the correct amount of film thickness.

Figure 5:
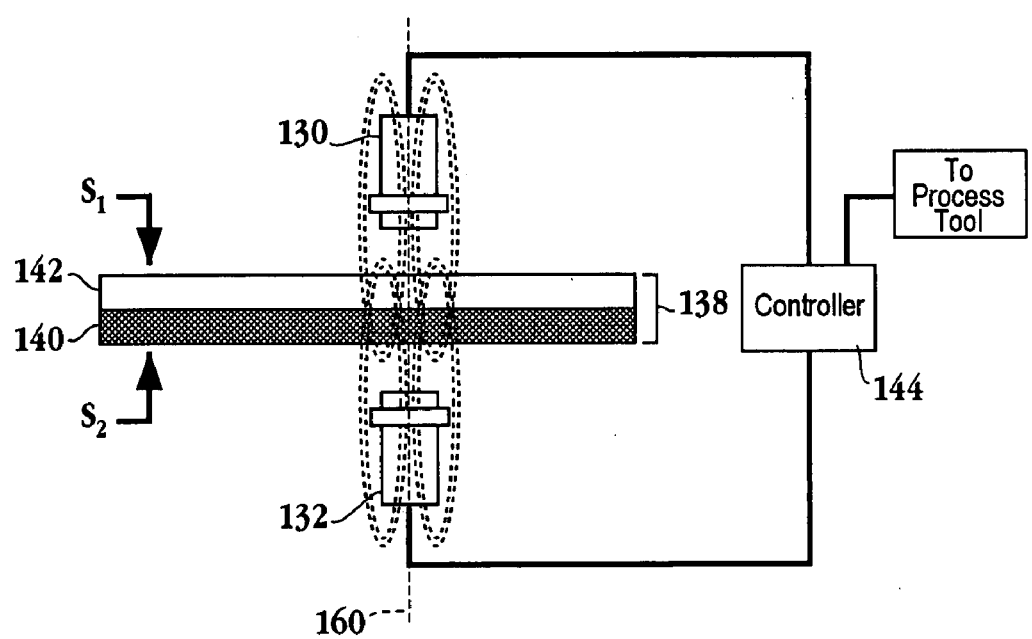
FIG. 5 is a simplified schematic diagram of an alternative configuration of coupled sensors for measuring an incoming thickness of a wafer or film in accordance with one embodiment of the invention.

FIG. 5 is a simplified schematic diagram of an alternative configuration of coupled sensors for measuring an incoming thickness of a wafer or film in accordance with one embodiment of the invention. Here, top sensor 130 and bottom sensor 132 share the same vertical axis 160. In order to eliminate any interference or suppression of the signals between the top and bottom sensors a different frequency can be applied for each of the respective sensors. Additionally, a phase shift can be applied so that the two sensors are out of phase. That is, one sensor overturns a wave of the signal by 180 degrees to eliminate suppression of the signal. Since distance is eliminated as a variable here as described above, the signal intensity is a function of thickness. Stated as a mathematical equation: $S=k(THK)$, where S is the signal intensity, k is the sensitivity coefficient and THK is the thickness. Where the signal intensity and the sensitivity coefficient are known for the above equation, the thickness can be determined through a calibration curve, in one embodiment. This determined thickness can be supplied to a downstream process tool dealing with thin metal films in a semiconductor fabrication process, such as a CMP tool as discussed with reference to FIGS. 8 and 9.

Figure 6A:
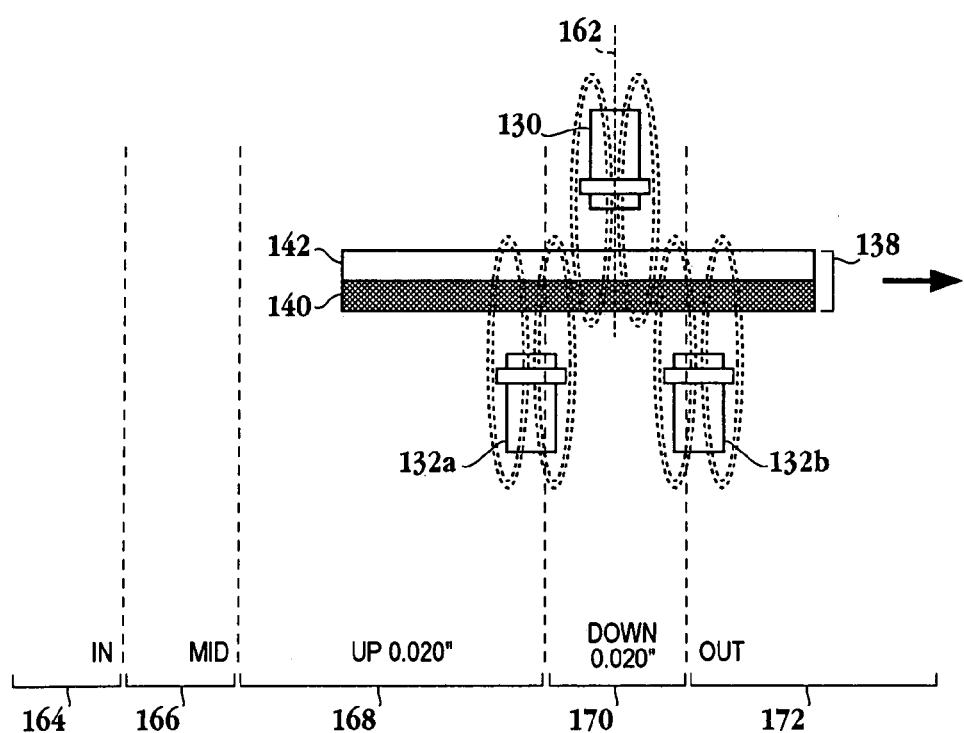
FIG. 6A is a simplified schematic diagram of another alternative configuration of coupled sensors for measuring thickness of an incoming wafer in accordance with one embodiment of the invention.

FIG. 6A is a simplified schematic diagram of another alternative configuration of coupled sensors for measuring thickness of an incoming wafer in accordance with one embodiment of the invention. In this embodiment, the sensor cluster is configured to determine the thickness of wafer 138 along axis 162 of top sensor 130. Bottom sensors 132a and 132b are positioned such that a distance from each sensor to axis 162 is the same. Thus, by averaging the signals from sensors 132a and 132b, the signal, and consequently the thickness, along axis 162 is determined. Here, interference or suppression of the signals between the top and bottom sensors is not a concern as bottom sensors 132a and 132b are offset from an axis of top sensor 130. Regions 164, 166, 168, 170 and 172 denote movement of wafer 138 as the wafer passes through a space defined between top sensor 130 and bottom sensors 132a and 132b. The significance of these regions are described in greater detail with reference to FIG. 6B.

Figure 6B:
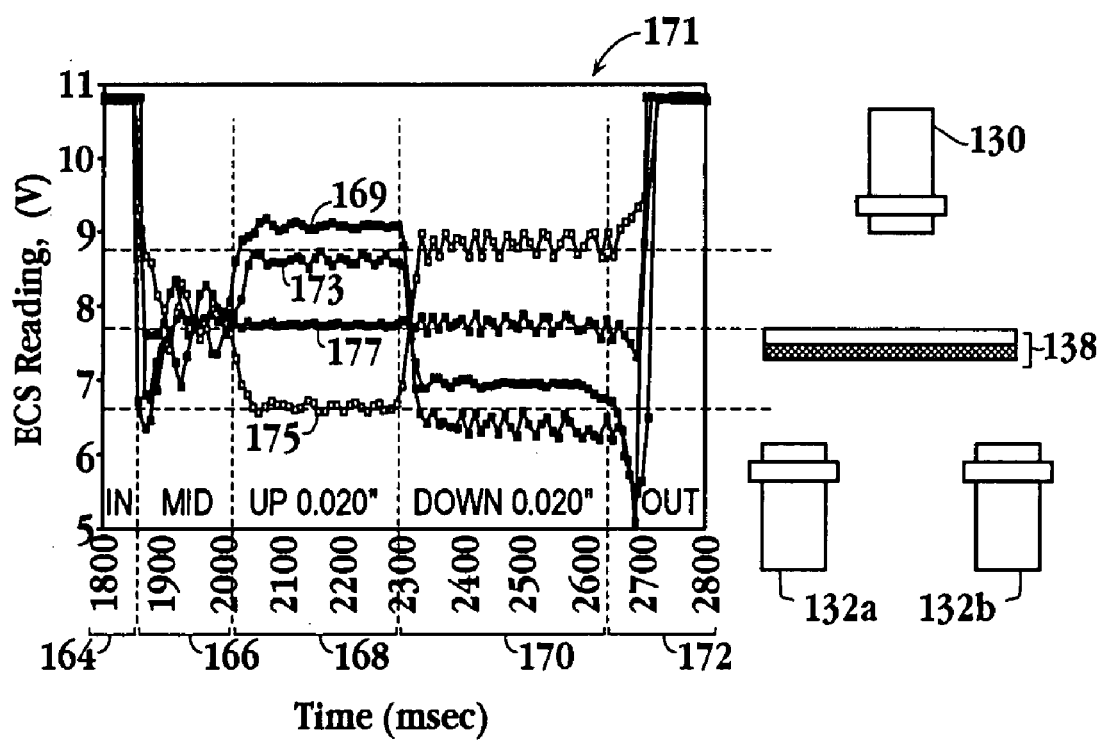
FIG. 6B is a graph illustrating the stability of an average signal when using an eddy current sensor cluster as configured to the side of the graph for detecting a film thickness in accordance with one embodiment of the invention.

FIG. 6B is a graph illustrating the stability of an average signal when using an eddy current sensor cluster as configured to the side of the graph for detecting a film thickness in accordance with one embodiment of the invention. In this configuration, eddy current sensor cluster includes a top sensor 130 and two bottom sensors 132a and 132b. Wafer 138 travels between top sensor 130 and bottom sensors 132a and 132b. Graph 171 plots the ECS readings in volts versus the time in milliseconds. Line 169 represents the reading from sensor 132a, while line 173 represents the reading from sensor 132b. Line 175 represents the reading from top sensor 130. In one embodiment, the signals from sensors 132a and 132b are averaged. This result is then averaged with the signal from sensor 130. The final averaged signal is represented by line 177. Graph 171 illustrates the various positions of wafer 138 as it passes through the sensor cluster. For example, wafer 138 comes into the sensor cluster and is represented on the graph by region 164. It should be appreciated that the ECS reading of 11 volts represents a starting point corresponding to a thickness of 0 as the wafer is not being measured here. The signals stabilize as the wafer edge passes through the sensor cluster. Then, the wafer continues along this midpoint travel path as represented in region 166. As can be seen, the average reading represented by line 177 stays relatively steady.

Next, the wafer is moved up by 0.020 inches. While the signal intensity, i.e., a difference between the measured signal and the reference signal at 0 thickness, from top sensor 130 becomes stronger, the signal intensity from bottom sensors 132a and 132b becomes weaker. However, the average represented by line 177 remains relatively constant. The wafer is then moved down 0.020 inches from the midpoint path. Accordingly, the signal intensity from top sensor 130 becomes weaker, while the signal intensity from bottom sensors 132a and 132b becomes stronger. As above, the average of the top sensor signal and the bottom sensor signal remains practically unchanged, i.e., relatively constant. Thus, as mentioned above, the sensor cluster supplies a stable distance-independent signal where the distance of the wafer from the sensor is irrelevant as the average of a top and bottom signal offsets variability from the wafer moving or even variation of the signal from wafer warping. Wafer 138 then moves out of the sensor cluster as depicted in region 172 where the signals vary as the sensors see the edge of the wafer upon exit. It should be appreciated that regions 164–172 of FIG. 6A represent a similar pattern of movement as described with respect to FIG. 6B. A graph of the movement of FIG. 6A would yield a substantially constant average signal as in FIG. 6B. One skilled in the art will appreciate that the sensors can be configured with one bottom sensor and one top sensor, one bottom sensor and two bottom sensors, or any other suitable configuration to offset the movement of the wafer so that a stable reading is maintained.

Figure 7A:
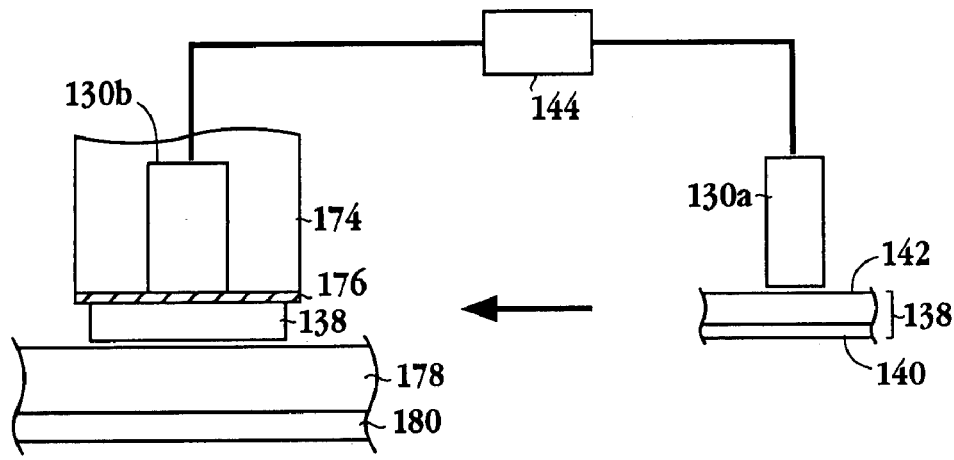
FIG. 7A is a simplified schematic diagram of an incoming thickness sensor coupled to a downstream CMP process thickness sensor in accordance with one embodiment of the invention.

FIG. 7A is a simplified schematic diagram of an incoming thickness sensor coupled to a downstream CMP process thickness sensor in accordance with one embodiment of the invention. Here, incoming thickness sensor 130a determines a thickness of the wafer and/or thin film 140 over substrate 142 of wafer 138. The signal indicating the determined thickness is communicated to controller 144. In turn, controller 144 communicates the signal to sensor 130b, which is embedded in wafer carrier 174 for a CMP process. In one embodiment sensors 130a and 130b are eddy current sensors. In another embodiment, sensors 130a and 130b are infrared sensors. It should be appreciated that by providing sensor 130b with the thickness of incoming wafer 138, a calibration can be performed to substantially eliminate the sensitivity to the distance between the sensor and the wafer. The variability in the distance between sensor 130b and wafer 138 can be caused by carrier film 176 compressing during working conditions or just due to the inherent variation of the thickness of the carrier film, which can be as great as +/−3 millimeters. Additionally, the distance between the top of polishing pad 178 and stainless steel backing 180 impacts the signal from sensor 130b. Again, the signal indicating the thickness of incoming wafer 138 can be used to calibrate sensor 130b to substantially eliminate variability caused by polishing pad tolerances and pad erosion that impact the distance between the top of polishing pad 178 and stainless steel backing 180.

Figure 7B:
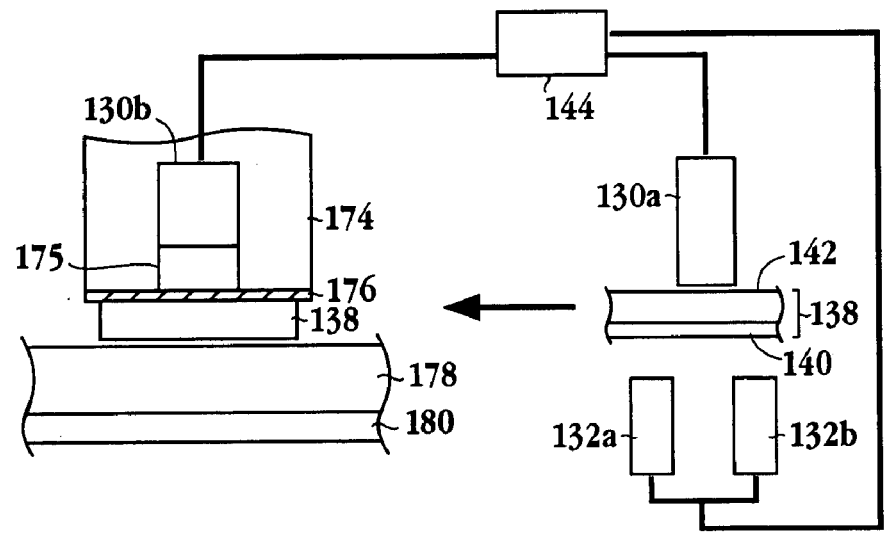
FIG. 7B is a simplified schematic diagram of an alternative embodiment of an incoming thickness sensor coupled to a downstream CMP process thickness sensor.

FIG. 7B is a simplified schematic diagram of an alternative embodiment of an incoming thickness sensor coupled to a downstream CMP process thickness sensor. In FIG. 7B, a sensor cluster consisting of top sensor 130a and bottom sensors 132a and 132b, is in communication with controller 144. Here, a suitable sensor cluster, such as the sensor cluster of FIGS. 6A and 6B, is provided to determine the incoming thickness of wafer 138 or of thin film 140 of the wafer. One skilled in the art will appreciate that the sensor cluster with reference to FIGS. 3 and 5 are suitable sensor clusters that can also be used to determine the thickness of wafer 138. In one embodiment, controller 144 averages the signal from bottom sensors 132a and 132b in order to determine a thickness signal for the thickness of wafer 138 along an axis of top sensor 130a through the wafer. The averaged signal of the bottom sensors is then averaged with the signal from top sensor 130a to determine a thickness of wafer 138 or thin film 140. This thickness is then communicated to embedded sensor 130b. As mentioned above with reference to FIG. 7A, an auto calibration can be performed for sensor 130b where the sensitivity to the distance between the sensor and wafer 138 and the sensitivity to the distance between the top of polishing pad 178 and stainless steel backing 180 are substantially eliminated. That is, the auto calibration can be performed in real-time to adjust the ECS readout for variation in sensor proximity due to pad-wear or other mechanical drift issues with the CMP carrier-to-plates mechanical displacements.

Sensor 130b of FIG. 7B is disposed over spacer 175. Spacer 175 is aligned with the bottom surface of wafer carrier 174. Spacer 175 is composed of any suitable material that is non-conductive. In one embodiment, spacer 175 is a polymer. In another embodiment, spacer 175 is between about 1 millimeter (mm) and about 1.5 mm thick. It should be appreciated that spacer 175 provides a window for sensor 130b to transmit and receive signals indicating the thickness and proximity of a wafer or film on a wafer.

While the embodiments of FIGS. 7A and 7B illustrate a sensor or sensor cluster for pre-CMP processing, a sensor or sensor cluster can also be located post CMP processing to provided information configured to improve run-to-run process control. While the incoming thickness allows for specific recipes to be downloaded to the process tool station to compensate for any incoming film thickness, the post CMP thickness allows for the correction of any detected process variation determined in the post-CMP thickness uniformity measurement. That is, the post-CMP thickness uniformity measurement is provided as feedback to sensor 130b, in order for sensor 130b to further fine tune the calibration settings to obtain an accurate endpoint. In one embodiment, controller 144 provides the feedback to sensor 130b from a post-CMP sensor cluster. In another embodiment, the eddy current sensors are commonly available eddy current sensors, such as GP-A series analog displacement sensors available from SUNX Limited. In another embodiment, multiple sensors can be placed in the wafer carrier of FIGS. 7A and 7B. The multiple sensors can be linked together to detect both wafer proximity and metal film-thickness. For example, a capacitance sensor can be included in the wafer carrier to determine a distance between the wafer and the ECS sensor. As the capacitance sensor is linked to the ECS sensor, the distance can be provided to the ECS sensor.

Figure 8A:
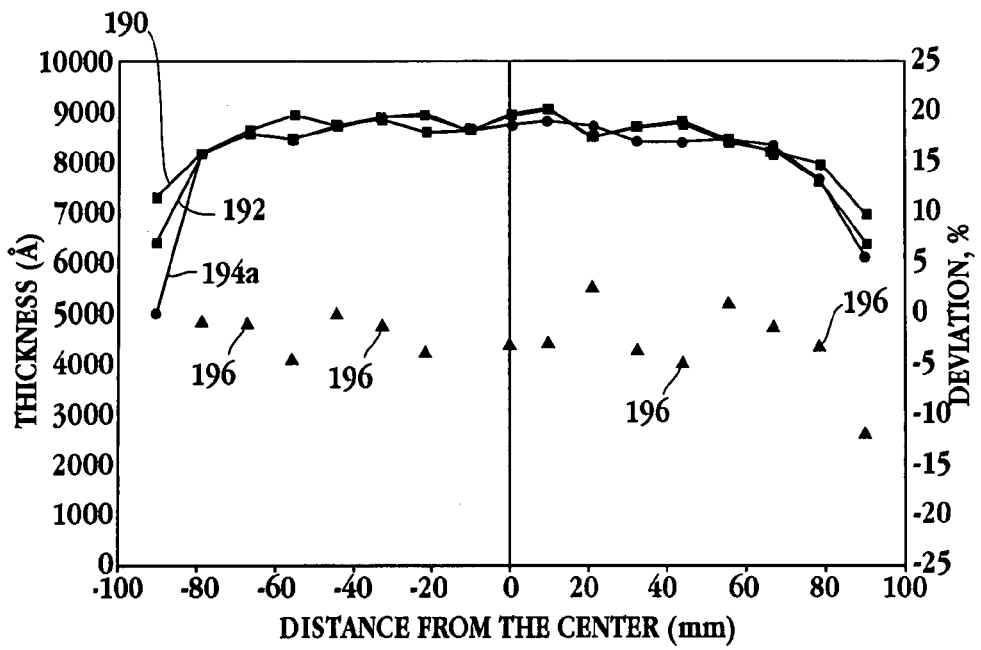
FIGS. 8A and 8B are graphs illustrating the correlation between the signal from an eddy current sensor for a film thickness and a signal from a standard resistivity film thickness measurement device in accordance with one embodiment of the invention
Figure 8B:
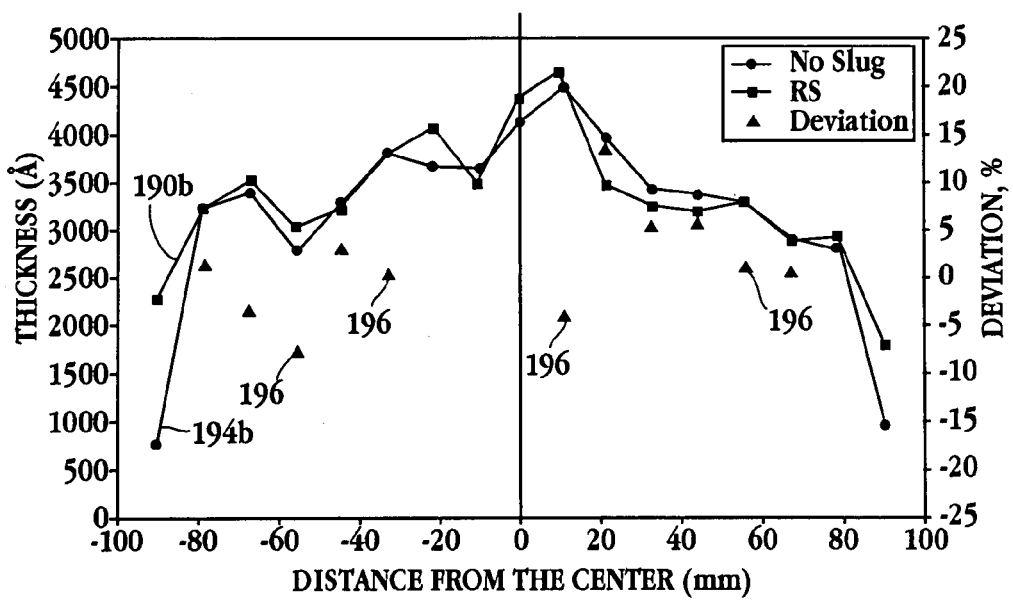

FIGS. 8A and 8B are graphs illustrating the correlation between the signal from an eddy current sensor for a film thickness and a signal from a standard resistivity film thickness measurement device in accordance with one embodiment of the invention. Line 190 of FIG. 8A represents the signal from a typical resistance sensor approach. Line 192 represents the signal from an eddy current sensor in the presence of a third metal body, such as the stainless steel backing of a polishing pad or belt, a wafer carrier, an air bearing platen, etc, of a CMP tool, at different points from the center of the wafer. Line 194*a* represents the signal from an eddy current sensor without the presence of a third metal body. Thus, the eddy current sensor closely correlates with the signals from a standard four point approach of the resistance measurement. Additionally, the percent deviation is within +/−5%, as illustrated by triangles 196, where each of the triangles corresponds to a difference between respective points on the lines above each of the triangles.

FIG. 8B similarly illustrates eddy current sensor measurements correlated to signals from a typical resistance sensor approach. Here, line 190*b* represents the signal from a typical resistance sensor approach, while 194*b* represents the signal from an eddy current sensor without the presence of a third metal body. It should be appreciated that the wafer measured in FIG. 8A is different than the wafer measure in FIG. 8B. Again the ECS signal 194*b* closely correlates with the RS75 signal. That is, the percent deviation between the signals is generally within +/−5% as illustrated by triangles 196. One skilled in the art will appreciate that the points at the ends of the lines correspond to the edge of the film, i.e., edge of the wafer, and are not considered as relevant.

Figure 9:
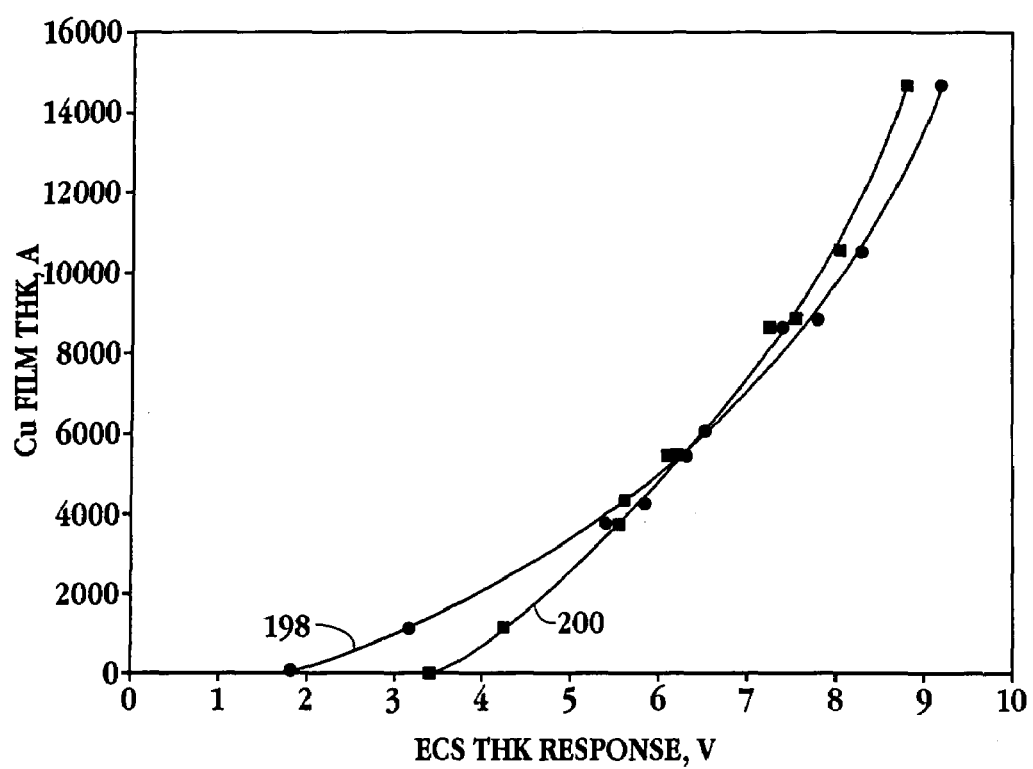
FIG. 9 is a graph illustrating a calibration curve for an eddy current sensor for measuring a copper film thickness in accordance with one embodiment of the invention.

FIG. 9 is a graph illustrating a calibration curve for an eddy current sensor for measuring a copper film thickness in accordance with one embodiment of the invention. Line 198 represents a film thickness of copper and the associated ECS voltage reading for that thickness without the presence of a third metal body. Line 200 represents a film thickness of copper and the associated ECS voltage reading for that thickness in the presence of a third metal body. One skilled in the art will appreciate that the calibration curves can be applied to the sensors described above with reference to FIGS. 3, 5, 6A, 6B, 7A and 7B. Additionally, calibration curves can be generated for any conductive film layer, as copper is described here for illustrative purposes only and not meant to be limiting.

Figure 10:
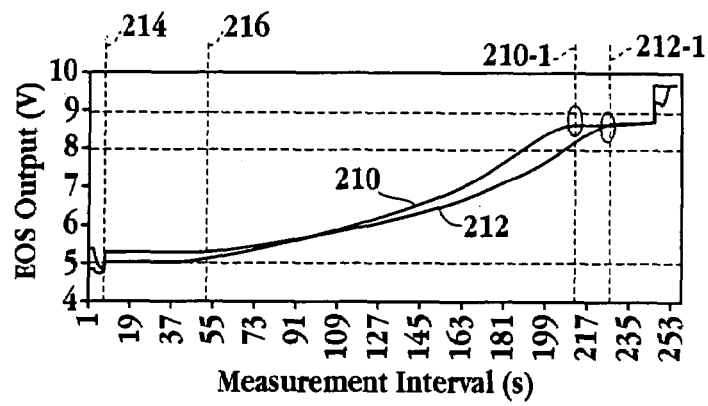
FIG. 10 is a graph illustrating two eddy current sensor output signals during a CMP operation of a copper thin film on a substrate in accordance with one embodiment of the invention.

FIG. 10 is a graph illustrating two eddy current sensor output signals during a CMP operation of a copper thin film on a substrate in accordance with one embodiment of the invention. Line 210 represents the ECS signal over time of the leading edge of the wafer undergoing the CMP operation. Line 212 represents the ECS signal over time of the trailing edge of the wafer undergoing the CMP operation. It should be appreciated that the region defined between line 214 and 216 removes the topography of the wafer, while the region after line 216 removes the copper overburden from the wafer. Point 210-1 represents the endpoint, i.e., clearing of the copper overburden, of the leading edge of the wafer. Point 212-1 represents the endpoint of the trailing edge of the wafer. One skilled in the art will appreciate that the information gathered from the ECS embedded in the wafer carrier will yield continuous data for determining a removal rate. Additionally, the removal rate variation between the leading edge and the trailing edge can be observed. Where the sensor is embedded in the wafer carrier, the sensor provides continuous real time data as to the thickness of the wafer or a film on the wafer being measured. That is, there is not a window where the sensor takes a snapshot once per revolution of a polishing belt or pad which provides discrete measurements. The embodiments described herein provide continuous measurement and thickness monitoring.

Figure 11A:
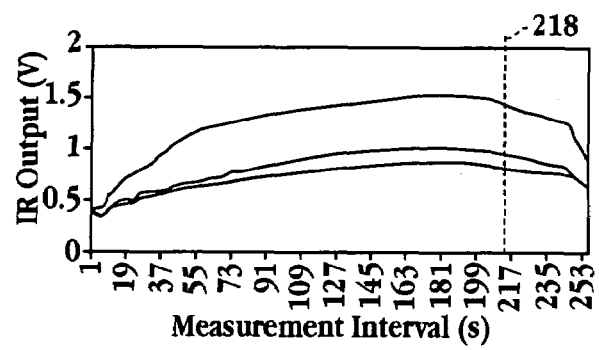
FIG. 11A is a graph of an Infrared (IR) sensor signal measuring the temperature of a polishing belt over time in accordance with one embodiment of the invention.

FIG. 11A is a graph of an infrared (IR) sensor signal measuring the temperature of a polishing belt over time in accordance with one embodiment of the invention. One skilled in the art will appreciate that a silicon substrate is transparent to the infrared signal, therefore, the infrared signal can detect the temperature of the thin film of the wafer being planarized by the surface of the polishing surface. The lines of the graph of FIG. 11A represent the monitoring of the infrared signal at various locations of the belt, such as the center front and back of the belt relative to an operator.

Figure 11B:
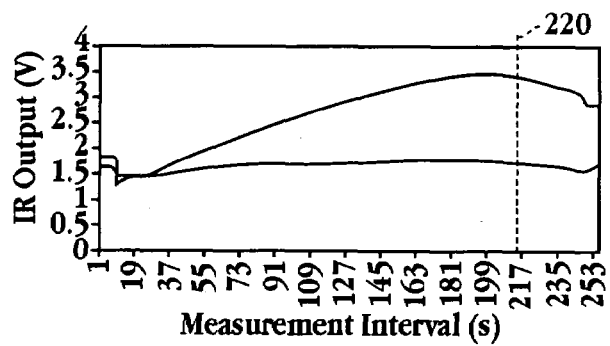
FIG. 11B is a graph of an Infrared signal of the wafer temperature over time in accordance with one embodiment of the invention.

FIG. 11B is a graph of an infrared signal of the wafer temperature over time in accordance with one embodiment of the invention. Here, the wafer temperature is being monitored to monitor temperature variation during CMP process flow. For each of the embodiments of FIGS. 11A and 11B, line 218 and 220, respectively, intersect the response lines of the graphs at the endpoint of the associated processes. That is, the belt temperature and wafer temperature begin to decrease at the endpoint, which is at an inflection point of the curves. In one embodiment, the wafer temperature changes by about 20 degrees Celsius and the belt temperature changes by about 10 degrees Celsius during the processing.

Figure 12:
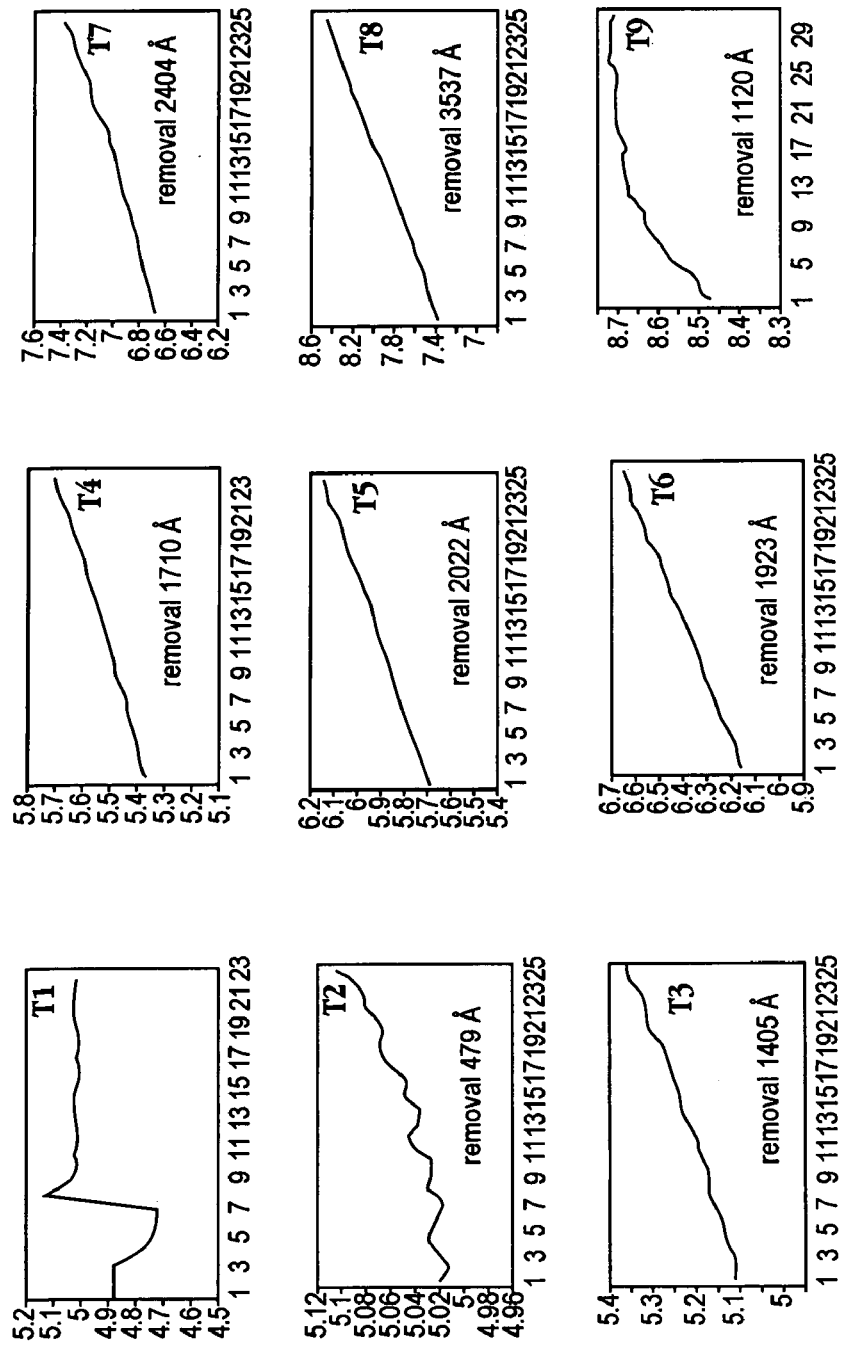
FIG. 12 is a schematic diagram of 30 second time sequences T1–T9 of a CMP process illustrating the removal of a copper film as measured by an eddy current sensor in the wafer carrier in accordance with one embodiment of the invention.

FIG. 12 is a schematic diagram of 30 second time sequences T1–T9 of a CMP process illustrating the removal of a copper film as measured by an eddy current sensor in the wafer carrier in accordance with one embodiment of the invention. Each of time sequences T1–T9 show the ECS signal on the y axis in volts and the time interval in seconds on the x axis. Time sequence T1 illustrates the initiation of the process, while time sequence T2 illustrates the beginning of the removal of the copper film. That is, 479 Å of material is removed in time sequence T2. Time sequences T3–T8 illustrate approximate 30 second periods and the associated amount of material removed during the time sequence. Time sequence T9 illustrates the occurrence of the endpoint condition.

Figure 13:
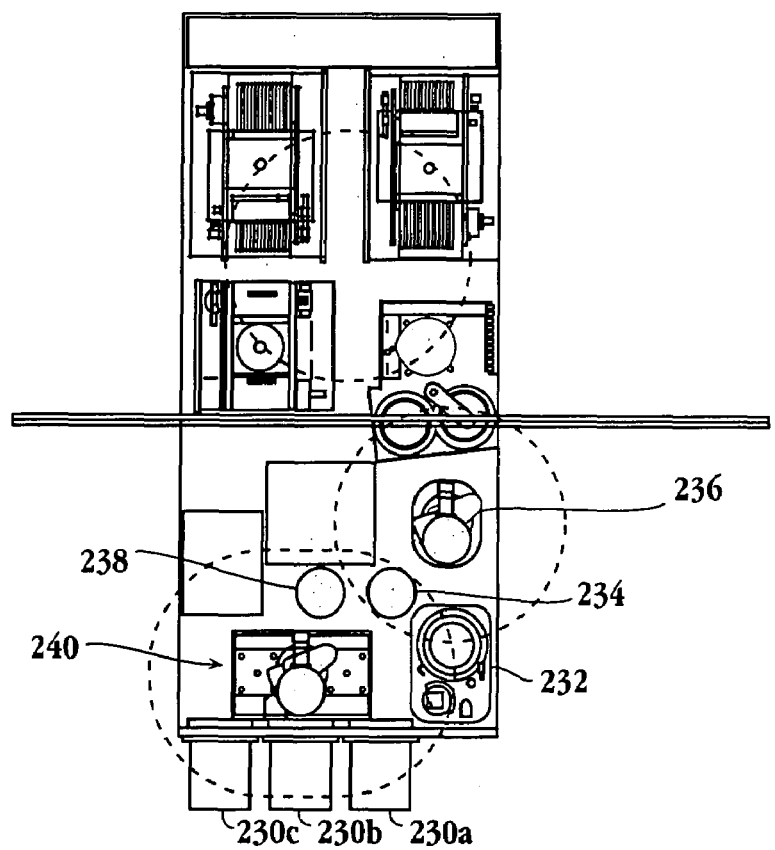
FIG. 13 is a high level schematic of a CMP system in accordance with one embodiment of the invention.

FIG. 13 is a high level schematic of a CMP system in accordance with one embodiment of the invention. As will be described below, the sensor cluster or array of sensor clusters can be incorporated into the front end of the CMP processing system to provided a thickness profile of the wafers as they are delivered to the processing module or received from the processing module. Load port modules 230*a*, 230*b*, and 230*c* contain wafers to be processed and/or wafers that have been processed. Robot 240 is configured to access load port modules 230*a*–*c* to transport the wafers to another station, such as dry buffer 208 or aligner 234. Robot 236 transports the wafer to and from the CMP processing module. Region 232 represents a spin, rinse and dry (SRD) module. It should be appreciated that a suitable sensor cluster, such as the sensor clusters discussed with reference to FIGS. 7A and 7B, can be integrated within the front end system of FIG. 13 in one embodiment. For example, the sensor cluster or even an array of sensor clusters can be integrated with aligner 234. Accordingly, as aligner 234 rotates the wafer, the thickness profile can be detected by the sensor cluster. Thus, no additional space is required, i.e., the footprint of the system is not affected, and the pathway of the wafer is not altered to obtain the information. While the sensor cluster is discussed with respect to a CMP tool, it should be appreciated that the sensor clusters can be incorporated with any tools dealing with thin metal films and using wafer aligners. Furthermore, a single sensor cluster can be incorporated into the embodiments described herein, or alternatively, an array of sensor clusters can be incorporated to cover a larger area for a more complete thickness profile of a wafer.

Figure 14:
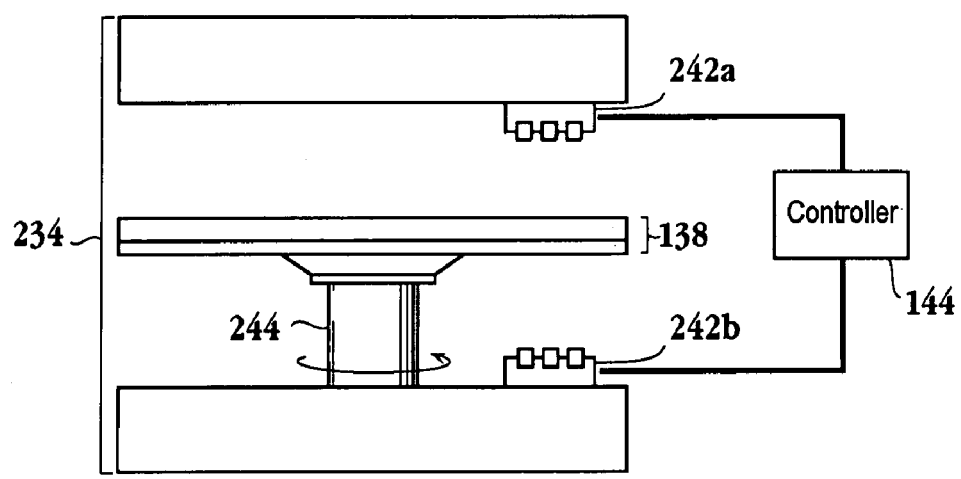
FIG. 14 is a cross sectional view of a simplified schematic of a wafer aligner with an integrated sensor cluster in accordance with one embodiment of the invention.

FIG. 14 is a cross sectional view of a simplified schematic of a wafer aligner with an integrated sensor cluster in accordance with one embodiment of the invention. Wafer aligner 234 includes spindle 244 that is configured to rotate wafer 138. In one embodiment, wafer 138 is held to spindle 244 through suction applied to a bottom surface of the wafer. Top sensor array 242a and bottom sensor array 242b each include a plurality of clustered sensors in each array. The clustered sensors of each array are configured to detect a signal indicating the thickness of a metal film on wafer 138. One suitable sensor cluster is an eddy current sensor cluster as described above with reference to FIGS. 6B and 7B. Top sensor array 242a is affixed to a top portion of aligner 234, while bottom sensor array is affixed to a bottom portion of the aligner. It should be appreciated that while top sensor array 242a and bottom sensor array 242b are illustrated as being offset from a center of the wafer, however, the sensor array and the sensor clusters making up the sensor array, can be positioned in any number of suitable locations over the wafer. In one embodiment, the sensor clusters included in top sensor array 242a and bottom sensor array 242b are offset between top and bottom sensors of a cluster such as with reference to FIGS. 3, 6A and 6B. In another embodiment, an axis of a top sensor of a sensor cluster in top array 242a is the same as an axis of a corresponding bottom sensor as discussed with reference to FIG. 5.

Each of the sensor clusters of the arrays of FIG. 14 are in communication with controller 144. As mentioned above, controller 144 is configured to average the signals from the sensor cluster to determine a thickness of the wafer. In one embodiment, a plurality of sensors are included in each top sensor array 242a and bottom sensor array 242b. Thus, as wafer 138 is spinning for the alignment process, the sensor arrays can map the thickness profile of the wafer through the sensor clusters included in the sensor arrays. In one embodiment, controller 144 is a computer which controls the process operation which wafer 138 is being delivered to. Here, the computer can store the thickness profile and adjust a recipe for the processing operation when wafer 138 is undergoing the processing operation. That is, the sensor clusters of the sensor array, when placed in the front end of the processing system allows for the customization for each wafer as it is processed. For example, the process variables for a CMP recipe, such as pressure, belt speed, etc., can be adjusted for a particular wafer. In other words, each process operation can be customized for a particular wafer. One skilled in the art will appreciate that controller 144 can be in communication with another controller or computer controlling the process operation and provide the thickness profile to the other controller or computer.

Figure 15:
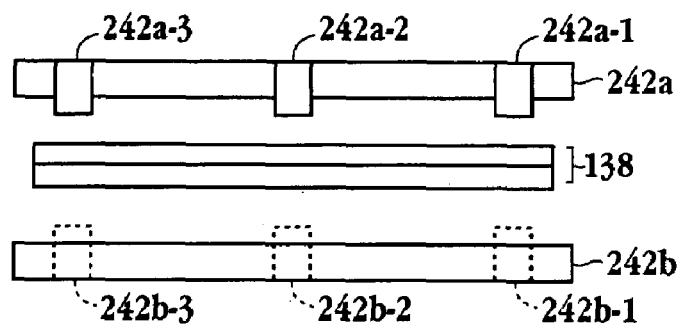
FIG. 15 is a more detailed side view of the sensor array containing a plurality of sensor clusters in accordance with one embodiment of the invention.

FIG. 15 is a more detailed side view of the sensor array containing a plurality of sensor clusters in accordance with one embodiment of the invention. Here, top sensor array 242a includes top sensors 242a-1, 242a-2 and 242a-3. Bottom sensor array 242b includes bottom sensors 242b-1, 242b-2, and 242b-3. In one embodiment each of the sensors are eddy current sensors. In the embodiment of FIG. 15, top eddy current sensors are offset from corresponding bottom eddy current sensors of a clustered set of sensors. However, as mentioned above, the top and bottom eddy current sensors can share a common axis by applying a phase shift between the top and the bottom sensors or using a different frequency.

Figure 16:
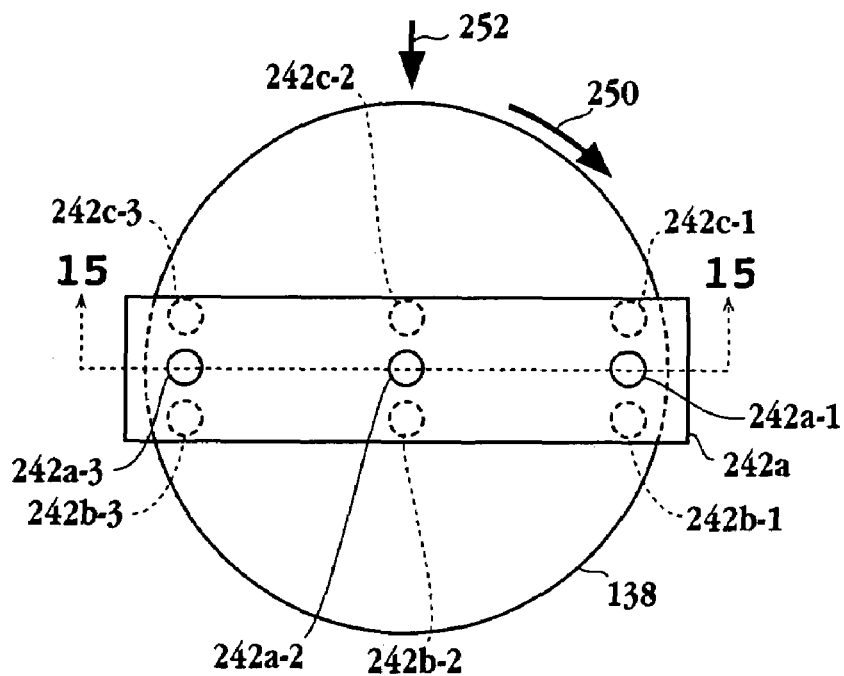
FIG. 16 is a top view of the sensor array containing a plurality of clustered sensors of FIG. 15 in accordance with one embodiment of the invention.

FIG. 16 is a top view of the sensor array containing a plurality of clustered sensors of FIG. 15 in accordance with one embodiment of the invention. Here it can be seen that top sensor array 242a includes top sensor 242a-1-242a-3. Bottom sensor array 242b includes bottom sensors 242b-1-242b-3 and 242c-1-242c-3. Thus, the sensor clusters of the sensor array are configured as described with reference to FIGS. 6B and 7B. As wafer 138 rotates in the aligner in the direction of arrow 250, the sensors generate a thickness profile of wafer 138 by detecting signals indicative of the thickness. Additionally, the sensors can monitor the thickness of the wafers as the wafer is moving linearly, in the direction of arrow 252, as the wafer is brought into the aligner. It should be appreciated that the sensor array can have any number of sensor clusters in any suitable pattern to map the thickness profile. Additionally, the sensors do not have to be evenly placed over the wafer. In one embodiment, the non-symmetrical placement of the corresponding top and bottom sensors, i.e., sensor clusters may provide a more detailed map of the thickness profile of wafer 138.

Figure 17A:
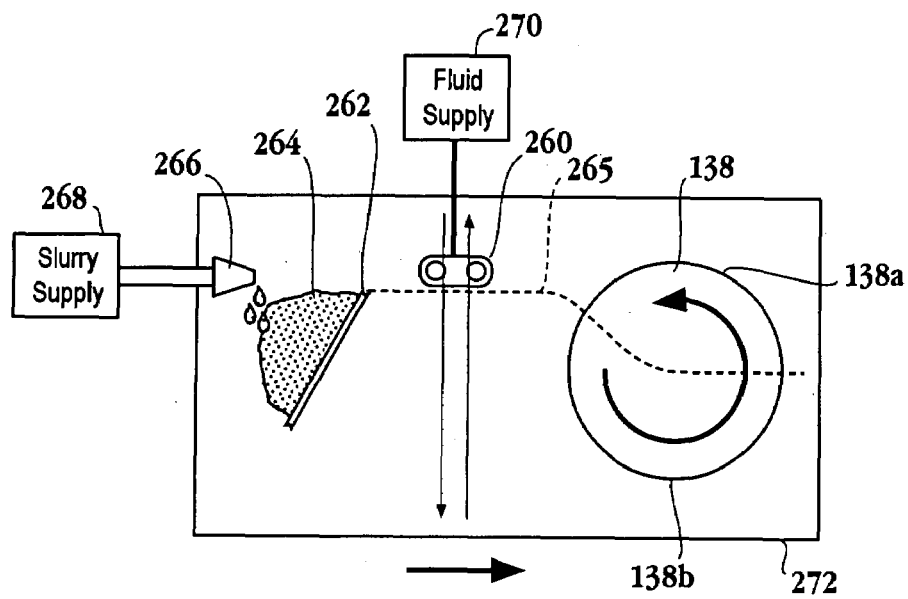
FIG. 17A is a simplified schematic diagram of a system capable of providing real time differential closed loop control for a chemical mechanical planarization operation in accordance with one embodiment of the invention.

FIG. 17A is a simplified schematic diagram of a system capable of providing real time differential closed loop control for a chemical mechanical planarization operation in accordance with one embodiment of the invention. Wafer 138 is rotated against polishing pad 272 while applying a downward force from a wafer carrier supporting wafer 138. Fluid flow restraining device 262, also referred to as a dam, is also forced against polishing pad 272. An edge of fluid flow restraining device 262 presses against polishing pad 272 creates a slurry lake 264 upstream from the fluid restraining device. Nozzle 266 delivers slurry to polishing pad 272. Slurry supply 268 supplies the slurry to be delivered to polishing pad 272. For example, slurry supply 268 may include a reservoir of slurry and a suitable pump to deliver the slurry. Nozzle 260 is configured to deliver a fluid downstream from the fluid flow restraining device 262. Fluid supply 270 supplies the fluid to nozzle 260. Here, the fluid may include slurry, deionized water, or some other suitable chemistry for a chemical mechanical planarization operation. In one embodiment, fluid supply 270 may include a pump or some other suitable delivery mechanism, such as pressurization. Thus, the location of nozzle 266 which is upstream from nozzle 260 and fluid flow restraining device 262, enables the differential control for removal rates being applied to wafer 138 during a chemical mechanical planarization operation. Fluid restraining device 262 creates a uniform slurry distribution downstream from the fluid restraining device. That is, by metering the amount of slurry from slurry lake 264 that passes under fluid flow restraining device 262, a uniform layer of slurry is disposed over polishing pad 272. It should be appreciated that any suitable means may be used to deliver fluid from fluid supply 270 to nozzle 260 such as pump, air pressure, etc. Similarly, the delivery of slurry to nozzle 266 from slurry supply 268 may be accomplished through any suitable means. Furthermore, as fluid flow restraining device 262 provides the uniform distribution of slurry over polishing pad 272, the delivery of slurry supply to nozzle 266 does not have to be an instrument requiring precise distribution of the slurry to the polishing pad. For example, a peristaltic pump may be used to deliver the slurry to nozzle 266, as fluid is collected in slurry lake 264 and then uniformly distributed through the configuration of fluid flow restraining device 262.

In one embodiment, fluid restraining device 262 is configured to allow more slurry to pass on a trajectory depicted by line 265 that enables the fresh fluid slurry to reach the center of wafer 138. It should be appreciated that the rotational velocity of wafer 138, along with the linear velocity of polishing pad 272, creates a situation where fluid directed at the center of wafer 138 is pushed off to the side due to the rotational velocity of the wafer. In that situation, e.g., where slurry is dripped onto a polishing pad, the center of wafer 138 experiences a lower removal rate due to a lesser amount of slurry being available for the center of wafer 138. In one embodiment, nozzle 260 may supply additional slurry downstream from fluid restraining device 262 in order to apply differential removal rates to portions of a surface of wafer 138. In this configuration, nozzle 260 may move along an arm extending across the width of polishing pad 272 as illustrated with reference to FIG. 19. The arm may be controlled by any suitable means such as a step motor, servo motor, etc., in order to direct slurry, deionized water, or some other suitable fluid on the surface of polishing pad 272 downstream from fluid flow restraining device 262, in order to manipulate the removal rate applied to wafer 138. For linear belt CMP systems, the belt is moving in a linear direction towards wafer 138 while wafer 138 is spinning about its axis. Thus, the relative velocity experienced by top section 138a of wafer 138 is greater than the relative velocity experienced by bottom section 138b during a rotation cycle of wafer 138. As a result, pad 272 tends to stain more in the region experiencing the higher relative velocity, due to the greater amount of debris being experienced at the upper half of belt 272. Thus, one function of fluid flow restraining device 262 is to collect and distribute the debris more uniformly rather than having the debris recycle in the same general area of pad 272, thereby extending the life of the pad and promoting a more uniform wearing pattern.

Another advantage of fluid flow restraining device 262, which may also be referred to slurry restraining device or fluid restraining device herein, is the prevention of irreversible pad surface modification due to the discreet mode of slurry dispensing. That is, the zebra effect is prevented through the use of fluid restraining device 262. It will be apparent to one skilled in the art that the zebra effect results from the uneven distribution, i.e., high slurry sections and low slurry sections from drip delivery systems which cause different local temperatures, friction coefficients, different chemistries, abrasion action, etc. Here, the method of dispensing the slurry has no impact due to the fluid restraining device 262. That is, fluid restraining device 262 controls the amount of slurry transferred to the wafer without manipulating the pumping rate of the supply pump or supply mechanism which is supplying the slurry. Thus, slurry rates as low as 30 cubic centimeters (cc) per minute and lower may be used to minimize the consumption of slurry for the embodiments described herein. As will be explained in more detail below, the local removal rate may be manipulated as per process monitoring system requests, by local flashing out of the thin slurry film or local augmentation of the thin slurry film after fluid restraining device 262, but prior to pad 272 engagement with wafer 138. Additionally, further manipulating the angle of fluid restraining device 262 relative to the linear direction of polishing pad 272, the gap between the fluid restraining device and the polishing pad, and the engagement curvature of the fluid restraining device relative to the polishing pad will provide further flexibility and options as to impacting the removal rate. Furthermore, fluid restraining device 262 may be composed of a number of sections as discussed below.

Figure 17B:
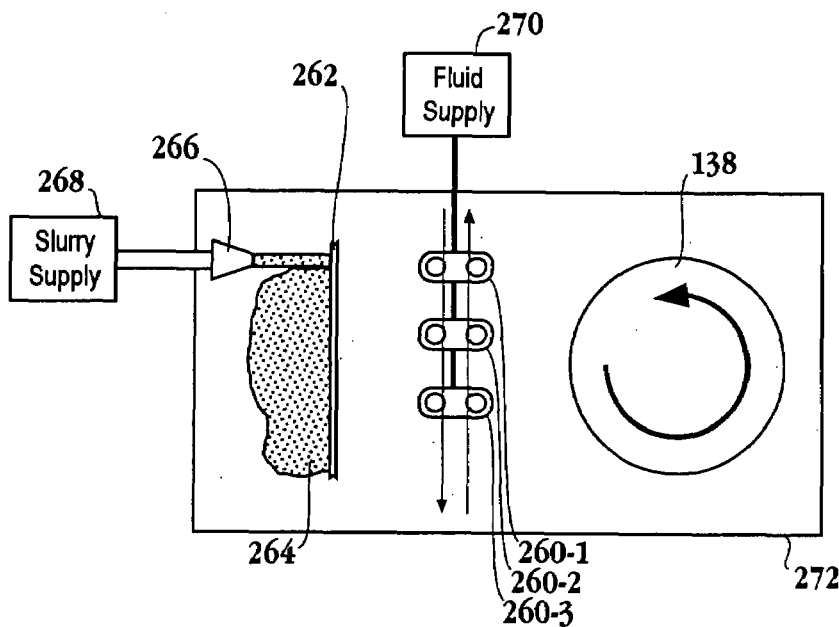
FIG. 17B is an alternative embodiment of the CMP system of FIG. 17A.

FIG. 17B is an alternative embodiment of the CMP system with reference to FIG. 17A. Here, fluid restraining device 262 is shown having a substantially perpendicular orientation to a linear direction of polishing pad 272. In addition, nozzles 260-1 through 260-3 provide the ability to create slurry starved areas on pad 272 or augment slurry to specific portions of pad 272 prior to the engagement of the specific portion of the pad with wafer 138. As described above with FIG. 17A, nozzles 260-1 through 260-3 may be moved in a plane parallel to pad 272 and/or a plane perpendicular to the pad. In another embodiment, a wafer carrier supporting wafer 138, i.e., wafer carrier 174 of FIGS. 7A and 7B, includes at least one sensor that is aligned with at least one of nozzles 260-1 through 260-3. Thus, a reading detecting a signal in real time may be used to create a locally starved slurry region or a locally augmented slurry region in order to manipulate the removal rate at a specific region on wafer 138. That is, where a specific region of wafer 138 is sensed as having a thickness that is less than another region of wafer 138, the removal rate experienced at the region having the lower thickness may be decreased by spraying deionized water through a nozzle (260-1 through 260-3) in order to create a slurry starved region. It should be appreciated that the slurry starved region may be created by the addition of deionized water or some other suitable fluid compatible with the CMP operation. The fluid delivered from nozzle 260-1 through 260-3 displaces a portion or substantially all of the slurry in a region of polishing pad 272 that is under the corresponding nozzles. Consequently, as the slurry starved region is encountered by wafer 138, the corresponding removal rate is lowered. It should be appreciated that where a slurry augmented region is created, the corresponding removal rate for the area of the wafer coming into contact with the slurry augmented region is likewise increased.

One skilled in the art will appreciate that fluid supply 270 may include a pump or some other suitable delivery mechanism. In addition, when dealing with a suspension, such as slurry, the fluid supply line from fluid supply 270 to nozzles 260-1 through 260-3 may be configured to recycle the slurry when not in use in order to maintain the suspension. In one embodiment, slurry may be delivered to nozzle 266 through a peristaltic pump. Here, the pulsating configuration of a peristaltic pump will not impact the planarization operation as fluid restraining device 262 controls an amount of slurry dispersed on pad 272 irrespective of the pumping rate. It will be apparent to one skilled in the art that fluid restraining device 262 may be clipped or affixed by other suitable means to an arm extending over polishing pad 272. The arm extending over polishing pad 272 may be manipulated in a vertical and/or horizontal position in order to impact the angle and gap, relative to polishing pad 272. In one embodiment, fluid restraining device is composed of the same material of polishing pad 272, i.e., polyurethane. It should be appreciated, however, that fluid restraining device 262 may be constructed from any material which is compatible with the CMP operation and is capable of creating slurry lake 264 while providing for the even distribution of slurry downstream for slurry lake 264.

Figure 17C:
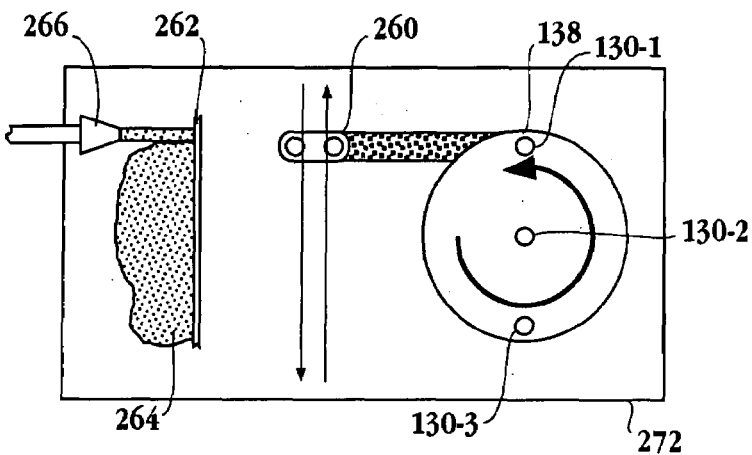
FIG. 17C is yet another alternative to the embodiment of FIG. 17A.

FIG. 17C is yet another alternative to the embodiment of FIG. 17A. Here, fluid restraining device 262 is configured to be at a slight angle relative to polishing pad 272. That is, a top portion of fluid restraining device 262 is closer to a back end of polishing pad 272 relative to the distance of a bottom portion of fluid restraining device 262 to the back end of polishing pad 272. Additionally, fluid restraining device 262 is shown as extending across the full length of polishing pad 272. It should be appreciated in this embodiment that slurry from slurry lake 264 may drip over the sides of polishing pad 272. In one embodiment, the excess slurry dripping over the side of polishing pad 272 may be recovered and recycled. Sensors 130-1 through 130-3 are included in wafer carrier 138. As mentioned above, each one of sensors 130-1 through 130-3 may be aligned with a nozzle. For example, each of sensors 130-1 through 130-3 may be aligned with nozzles 260-1 through 260-3, respectively. As mentioned above with reference to FIG. 17A, corresponding to a sensor positioned to detect a thickness at the wafer center may be slightly offset from a trajectory line through the wafer center to account for the rotational velocity of the wafer during the processing operation. In one embodiment, sensors 130-1 through 130-3 are eddy current sensors. In another embodiment, fluid restraining device 262 may be composed of a plurality of sections, where each section may be independently controlled. For example, the downward force applied to each section may be used to define different slurry thickness layers over pad 272. In turn, the different slurry thickness layers will apply different removal rates to the corresponding wafer being planarized.

Figure 18:
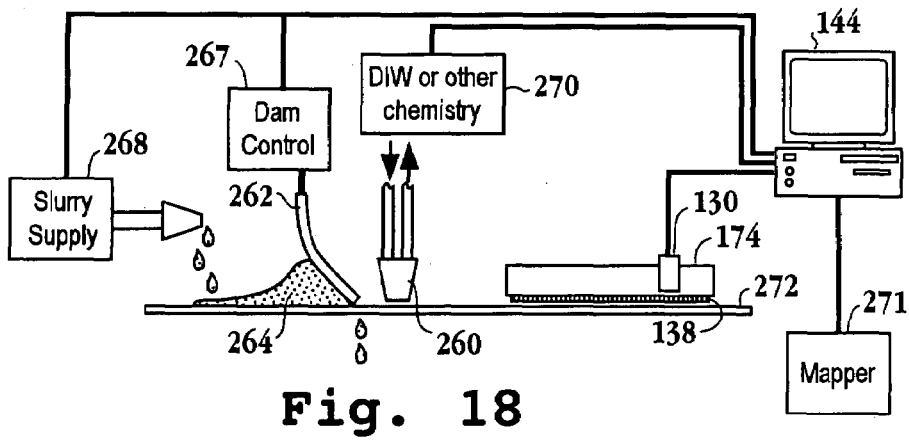
FIG. 18 is a simplified schematic diagram of the controller configuration for a CMP system in accordance with one embodiment of the invention.

FIG. 18 is a simplified schematic diagram of the controller configuration for a CMP system in accordance with one embodiment of the invention. General purpose computer 144, which also may be referred to as a controller, coordinates the various control activities for the CMP system. Mapper 271 is in communication with general purpose computer 144. Mapper 271 may include an alignment station, e.g., the aligner described with reference to FIGS. 14–16. In one embodiment, mapper 271 is configured to scan a surface of wafer 138 prior to planarization in order to create a thickness map of the wafer. As discussed above, the thickness map may be generated through the use of arrays of eddy current sensor clusters. The signals corresponding to the thickness map are then communicated to general purpose computer 144 where they may be stored, such as on a hard disk drive or other suitable storage media. It should be appreciated that the system described herein may be thought of as three components in one embodiment. For example, the three components include a signaling system, which includes the sensing devices, i.e., eddy current sensors, the executive system, which includes the CMP unit with the fluid flow restraining device configuration and a controller as described above.

Wafer carrier 174 supports wafer 138 over polishing pad 272. As described with reference to FIGS. 7A, 7B and 17C, wafer carrier 174 may include one or more sensors configured to detect a thickness associated with a film on wafer 138 which is being planarized. Furthermore, correlation coefficients calculated through the thickness map generated by mapper 271 may be applied to a signal detected by sensor 130 in order to substantially eliminate a substrate component and any third body effects detected by sensor 130. For example, where sensor 130 is an eddy current sensor, other conductive surfaces will impact the signal detected by sensor 130. The other conductive bodies include a stainless steel backing of polishing pad 272 and other commonly used conductive material associated with the CMP system that is within the detection region of sensor 130. The calibrated signal generated by sensor 130 is communicated to general purpose computer 144. Alternatively, the signal generated by sensor 130 may be communicated to general purpose computer 144 and the correlation coefficient or coefficients then applied to the raw signal data.

According to the value of the adjusted signal, control signals for deionized water or other chemistry module 270, dam control module 267, and slurry supply module 268 may be generated. Thus, if the signal generated by sensor 130 indicates that a removal rate is too low, i.e., the thickness at the corresponding location of wafer 138 is relatively high, then general purpose computer 144 may transmit a signal to deionized water or other chemistry module 270, which results in slurry being distributed from nozzle 260 onto polishing pad 272 in order to increase the removal rate experienced in the region of wafer 138 corresponding to sensor 130. Likewise, if the signal generated by sensor 130 indicates that the removal rate is too high, i.e., the thickness is lower in the region of wafer 138 corresponding to sensor 130, then deionized water or some other suitable displacement chemistry may be distributed from nozzle 260 in order to reduce the removal rate experienced at the corresponding point on wafer 138.

While FIG. 18 illustrates a single sensor 130 and a single nozzle 260, multiple sensors each corresponding to a nozzle in a one to one configuration may be utilized in order to manipulate the removal rate in a differential fashion at localized areas of the interface between wafer 138 and polishing pad 272. Furthermore, general purpose computer 144 may issue a signal transmitted to dam control module 267 which impacts the downward force or angle of curvature applied to fluid restraining device 262 relative to pad 272. Thus, the thickness of the slurry distributed over polishing pad 272 downstream from fluid restraining device 262 may be manipulated through dam control module 267. General purpose computer 144 is also configured to transmit a signal to slurry supply module 268 in order to increase or decrease a slurry supply to polishing pad 272. Therefore, the slurry supply to polishing pad 272 along with the manipulation of fluid restraining device 262 will impact the configuration of slurry pool 264.

Figure 19:
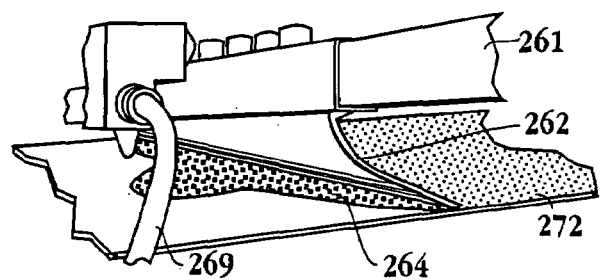
FIG. 19 is a simplified schematic diagram illustrating the fluid restraining device and the creation of a slurry pool in accordance with one embodiment of the invention.

FIG. 19 is a simplified schematic diagram illustrating the fluid restraining device and the creation of a slurry pool in accordance with one embodiment of the invention. Here, slurry delivery line 269 supplies slurry to a nozzle or a manifold in flow communication with of a plurality of nozzles in order to supply slurry to polishing pad 272. Fluid restraining device 262 is affixed to arm 261. In one embodiment, fluid restraining device 262 is affixed such that the fluid restraining device may be easily attached and detached to arm 261, e.g., clipped to the arm. As discussed above, arm 261 is configured to move horizontally and vertically with respect to polishing pad 272 in order to impact the angle and the degree of curvature of fluid restraining device 262. For example, by modulating the force applied in a downward direction, the angle defined by the fluid restraining device relative to the top surface of polishing pad 272 may be adjusted. In addition, the angle defined by the fluid restraining device in relation to the flow direction may be adjusted by rotating the arm about its axis in a plane parallel to the polishing pad.

Figure 20:
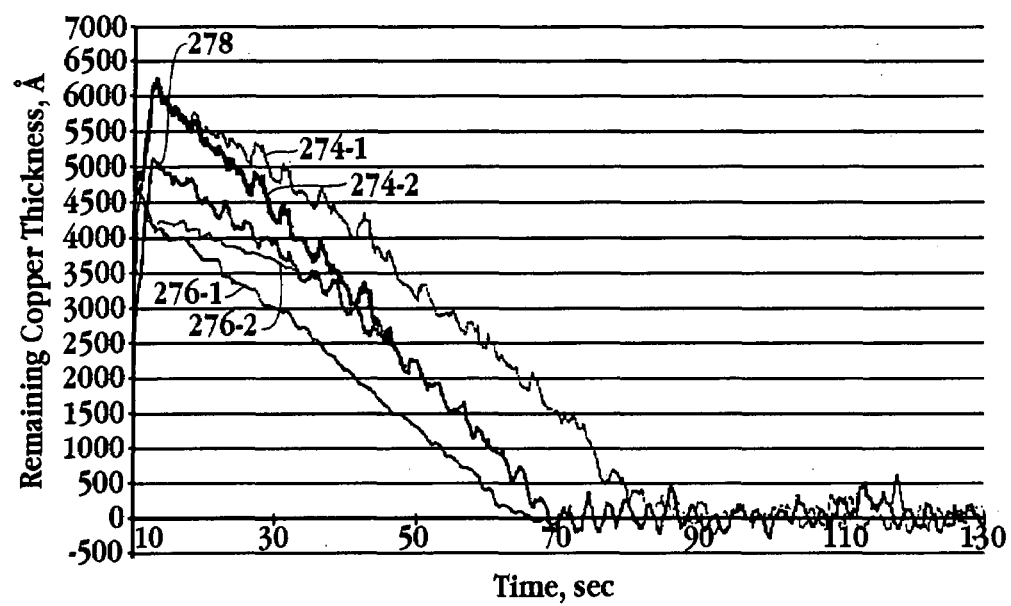
FIG. 20 is a graph illustrating exemplary results of the impact of differential removal rates enabled through the embodiments described herein.

FIG. 20 is a graph illustrating exemplary results of the impact of differential removal rates enabled through the embodiments described herein. The graph of FIG. 20 plots the copper thickness on the Y axis versus time on the X axis. The copper thickness represents the thickness of a copper film disposed over a substrate. The remaining copper thickness is determined through a signal detected by an eddy current sensor as described in the embodiments discussed above. Here, lines 274-1 and 276-1 represent removal rates that remain substantially constant. Thus, at any point in time, the remaining copper thickness is different. However, by employing the embodiments described above to apply differential control of the removal rates to certain areas of a wafer being planarized, traces 274-1 and 276-1 are transformed to traces 274-2 and 276-2, respectively, which then converge to trace 278. That is, trace 274-2 and trace 276-2 converge to a target removal rate illustrated by trace 278. It should be appreciated that the removal rate illustrated by trace 278 may be a removal rate applied at a region of the wafer associated with one sensor in the wafer carrier, while the traces represented by lines 274-2 and 276-2 are each associated with other single sensors. For example, the sensors illustrated with reference to FIG. 17C may each be associated with one of the three traces represented by lines 274-2, 276-2 and 278. The differential removal rates applied to a surface of a substrate enable the ability to more uniformly control a remaining film thickness layer disposed over a substrate during a planarization process. As illustrated in FIG. 20, after approximately 2500 angstroms the removal rate applied to the various areas represented by signals 274-2, 276-2 and 278 are all uniform. Thus, stopping the process at any time between a remaining thickness layer of zero and 2500 angstroms results in a more uniform film thickness layer across the surface of the substrate.

Figure 21:
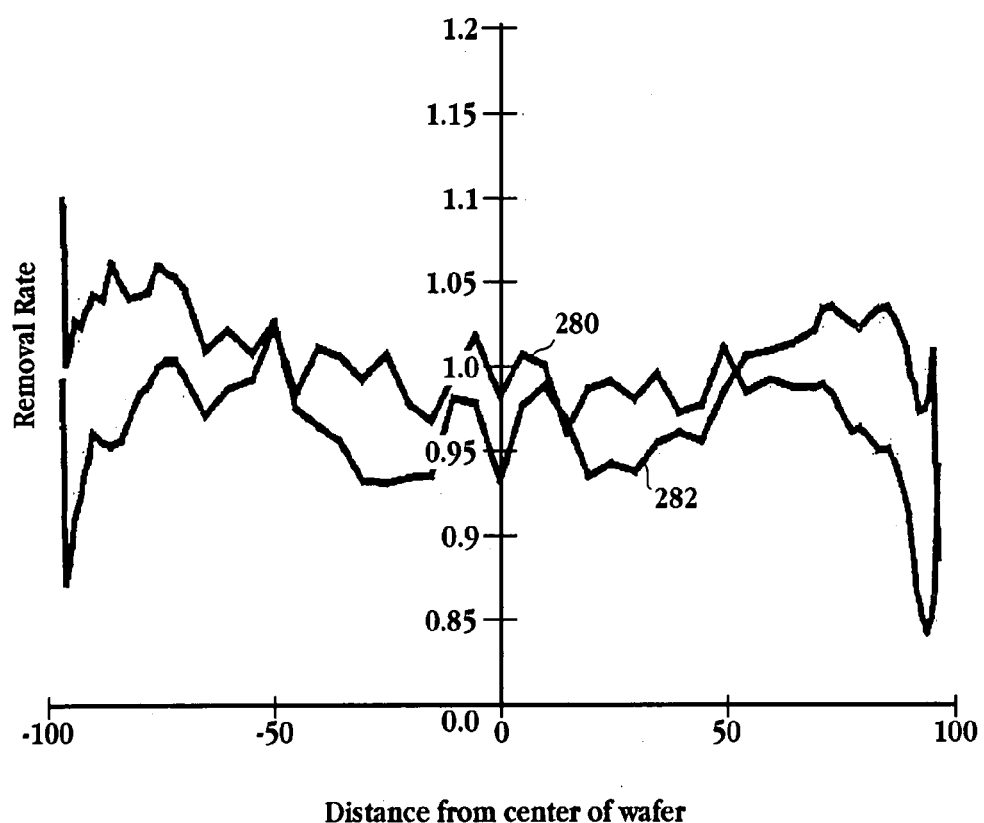
FIG. 21 is a graph illustrating the effects of a chemistry such as deionized water, dispersed to a surface of a polishing pad after a fluid restraining device in accordance with one embodiment of the invention.

FIG. 21 is a graph illustrating the effects of a chemistry such as deionized water, dispersed to a surface of a polishing pad after a fluid restraining device in accordance with one embodiment of the invention. Here, line 280 represents a trace of a removal rate relative to the distance from a center region of a wafer being planarized. Line 282 similarly represents the plot of the removal rate across a surface of wafer while it is being planarized. Line 280 results from the disbursement of deionized water to the edge regions of a substrate while line 282 results from the dispersal of deionized water or a similar displacing agent applied to a center region of the wafer being planarized. Thus, the deionized water or displacing agent creates a slurry starved region where the removal rate drops. For example, with respect to line 280, the removal rate at the edge region of a wafer as compared as compared to line 282, decreases. However, the removal rate depicted by line 282 in the center region is less than the removal rate depicted by line 280 in the corresponding region. That is, the displacing agent creates a slurry starved area of the polishing pad which corresponds to the center region of the wafer being planarized. It should be appreciated that tighter control in both the center region and the edge region of the wafers is achieved through the embodiments described herein. As mentioned above, in order to achieve a decreased removal rate at the center of the wafer, the nozzle creating the slurry starved region may be slightly offset from the center of the wafer due to the rotational velocity of the wafer.

Figure 22A:
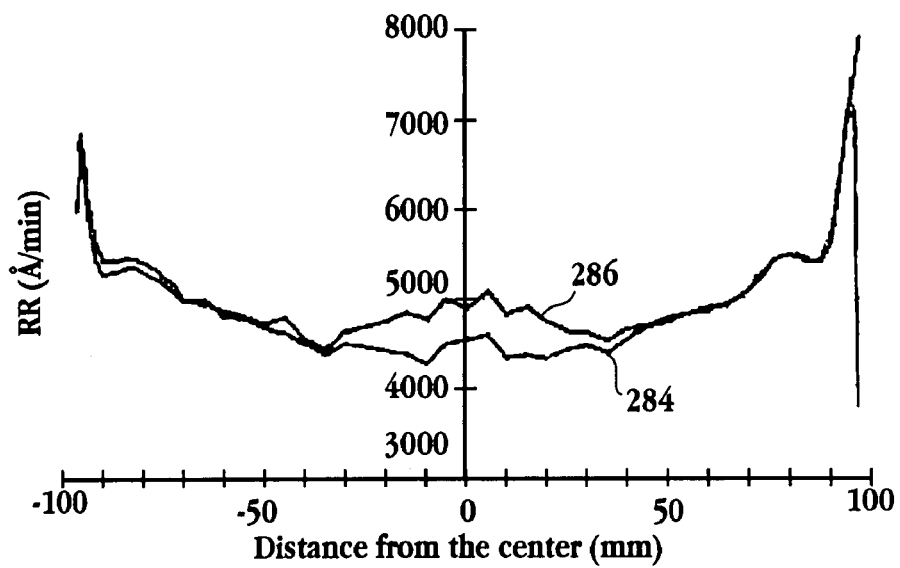
FIGS. 22A and 22B illustrate graphs representing the addition of slurry to various regions of the polishing pad during a chemical mechanical planarization operation in accordance with one embodiment of the invention.
Figure 22B:
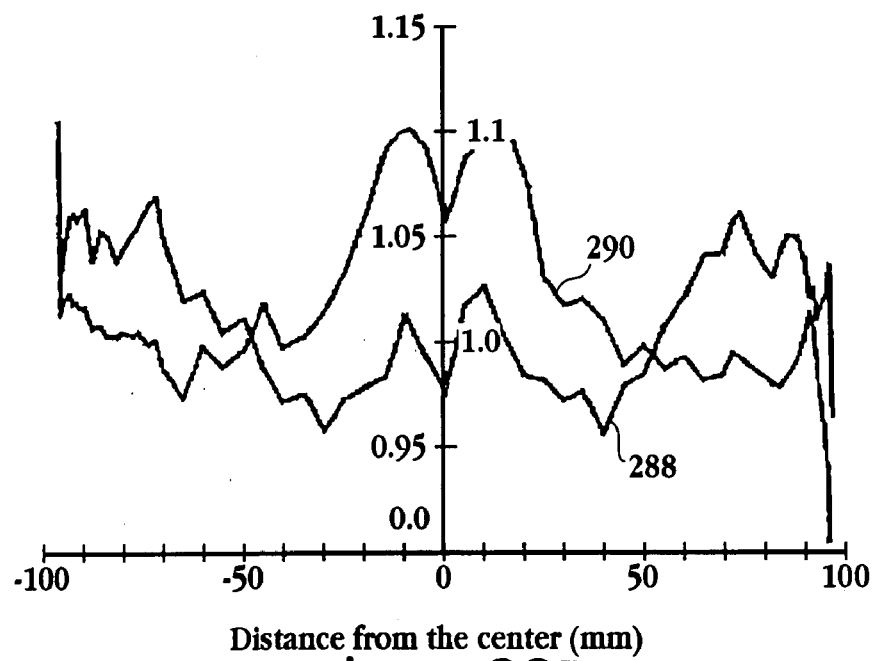

FIGS. 22A and 22B illustrate graphs representing the addition of slurry to various regions of the polishing pad during a chemical mechanical planarization operation in accordance with one embodiment of the invention. FIG. 22A is a graph illustrating the effect of adding slurry to a center region of the polishing pad corresponding to a center of the wafer being planarized. Line 284 represents the trace of the removal rate versus the distance from the center of the wafer when a fluid restraining device is used to distribute slurry across a polishing pad without any slurry being added downstream. Line 286 represents the results obtained when adding slurry after the fluid restraining device to a position on the polishing pad which will eventually be seen by a center region of a wafer being planarized. Here, a nozzle downstream of the fluid restraining device augments a portion of the uniform slurry layer created by the fluid restraining device. Thus, the additional slurry added to the center region results in the removal rate increasing as depicted by line 286.

FIG. 22B represents line traces corresponding to the addition of slurry to either a center region of the polishing pad, or an edge region of the polishing pad in accordance with one embodiment of the invention. Line 290 represents a trace of the removal rate where slurry has been added to the center region of the polishing pad, while line 288 represents a trace of the removal rate where slurry has been added to the edge region of the polishing pad. For example, with reference to FIG. 17B, nozzles 260-1 and 260-3 may be used to supply slurry to an edge region while nozzle 260-2 may be used to supply deionized water to a center region. As can be seen in FIG. 22B, the addition of slurry to the center region results in an increased removal rate of line 290 relative to line 288. At the same time, line 288 illustrates the results of adding slurry to an edge region to increase the removal rate relative to line 290 at the edge region. It will be apparent to one skilled in the art that while the embodiments described herein include one or three sensors in the wafer carrier and associated nozzles, any suitable number of sensors and nozzles may be implemented.

Figure 23:
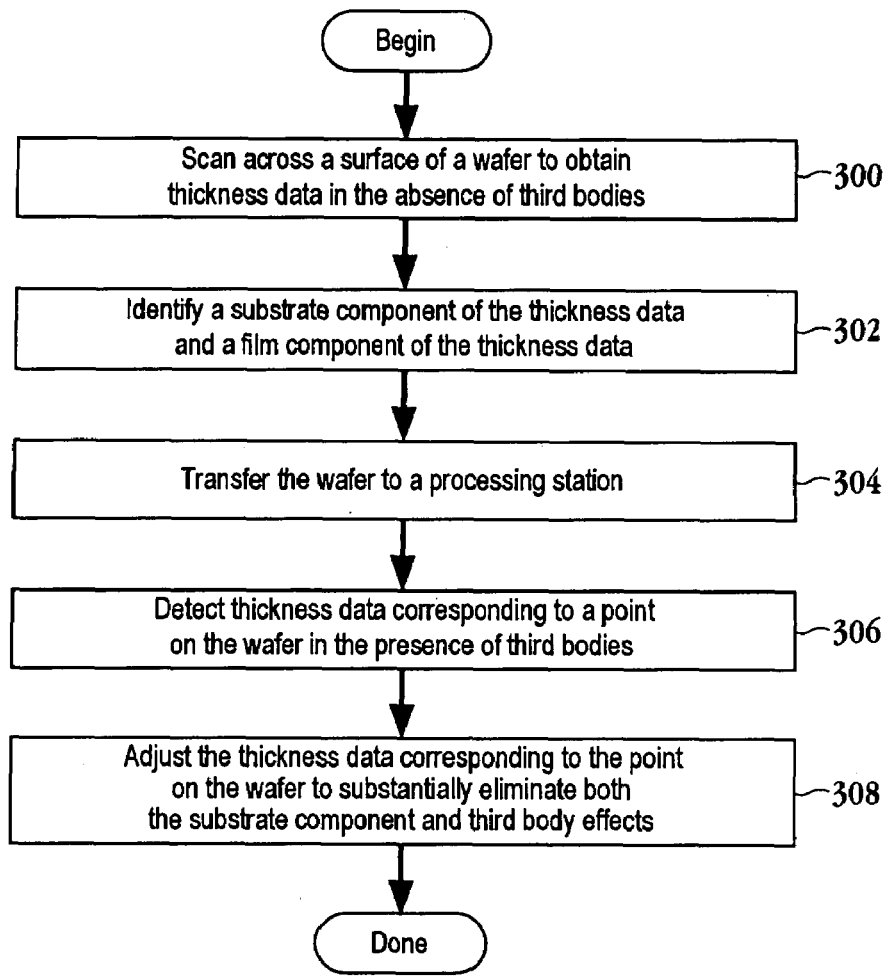
FIG. 23 is a flow chart diagram illustrating the method operations of monitoring a film thickness exposed over a substrate in real time in accordance with one embodiment of the invention.

FIG. 23 is a flow chart diagram illustrating the method operations of monitoring a film thickness exposed over a substrate in real time in accordance with one embodiment of the invention. The method initiates with operation 300 where the surface of a wafer is scanned to obtain thickness data in the absence of third bodies. Here, an aligner or some other transfer station may be used to scan the surface of the wafer to create a thickness map as described above. Third bodies, i.e., conductive surfaces are not present here as only the wafer and the scanning mechanism is used to create the thickness map. The method then advances to operation 302 where a substrate component of the thickness data and a film component of the thickness data is identified. Here, the signal generated by scanning the surface of the wafer is subdivided into the substrate component and a film component. For example, an eddy current signal may be broken down into the two components. It should be appreciated that from this component data, calibration coefficients may be generated which may be subsequently applied to a downstream measurement of the thickness, i.e., a sensor embedded in a wafer carrier, in order to more precisely determine the thickness. The method then proceeds to operation 304 where the wafer is transferred to a processing station. In one embodiment, the processing station is a CMP system. Of course, any suitable robotic means may be used to transfer the wafer to the processing station. The method then moves to operation 306 where the thickness data corresponding to a point on the wafer in the presence of third bodies is detected. Here, a sensor embedded in the wafer carrier as described above with reference to FIGS. 7A and 7B may be used to detect the thickness data. In one embodiment, an eddy current sensor is used for this detection. The method then advances to operation 308 where the thickness data corresponding to the point on the wafer is adjusted to substantially eliminate both the substrate component and the third body effects. That is, the calibration coefficient determined in the absence of third bodies is used to isolate the thickness data related to the film on the wafer. As will be discussed in more detail below, this isolated thickness data may then be used to control a planarization operation in a differential manner in order to provide a more uniform planarization operation across the surface of wafer.

Figure 24:
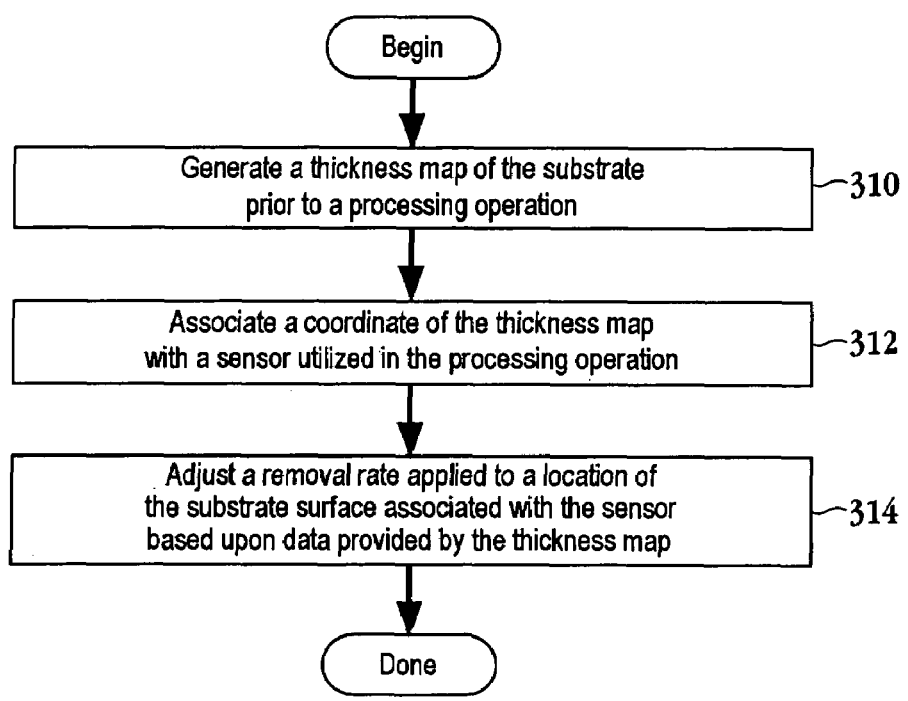
FIG. 24 is a flow chart diagram illustrating the method operations for providing differential control for removal rates applied to a substrate surface in accordance with one embodiment of the invention.

FIG. 24 is a flow chart diagram illustrating the method operations for providing differential control for removal rates applied to a substrate surface in accordance with one embodiment of the invention. The method initiates at operation 310 where a thickness map of the substrate is generated prior to a processing operation. The thickness map may be generated as described above with reference to FIG. 23. The method then advances to operation 312 where a coordinate of the thickness map is associated with a sensor utilized in the processing operation. Here, a point on the thickness map may be associated with a sensor embedded in the wafer carrier so that the planarization process may be controlled in the region associated with the sensor embedded in the wafer carrier. A general purpose computer, or controller, as described above may provide the calculations necessary to make this association. The method then proceeds to operation 314 where a removal rate applied to a location of the substrate surface associated with the sensor is adjusted based upon data provided by the thickness map. Here, the removal rate may be adjusted by creating a slurry deficient region or a slurry augmented region on the surface of a polishing pad downstream from a dam, i.e., fluid restraining device, as described above with reference to FIGS. 17A through 22B.

In summary, the present invention provides for the application of differential removal rates to the surface a wafer having a film disposed thereon. Thus, the determination of an endpoint of a semiconductor fabrication process, such as a CMP process, may be based on time. That is, the differential removal rates may be applied in order to arrive at a substrate having a uniform film thickness. Thus, after a certain time or after a certain thickness is detected a signal indicating an endpoint of the operation has been reached may be issued to stop the operation. The clustered sensors allow for the determination of the endpoint and associated removal or deposition rates by initially determining a thickness of a film on the wafer under non-process conditions. The determined thickness is provided to a second sensor associated with the process operation in order to calibrate the sensor so that variables from processing conditions that cause error in the thickness measurement (third body effects) are substantially eliminated. For example, a calibration coefficient determined under non-process conditions, i.e., without third bodies in the detection region, may be applied to the signal of the second sensor in order to substantially eliminate the third body effects introduced by the processing module. In addition, a thickness map of the wafer is generated where the thickness map breaks down the data into a film thickness component and a substrate component, in order to isolate the film thickness component. As mentioned above, the thickness map is determined under non process conditions.

It should be appreciated that while the embodiments have been described in terms of a CMP process, the clustered sensors or arrays containing clustered sensors are not limited to a CMP process. For example, the sensors can be used within any semiconductor process that removes or deposits a layer or film on a substrate, such as etch, deposition and photoresist stripping processes. Furthermore, the above described embodiments may be applied to rotary or orbital type CMP systems as well as the belt type CMP system.

In addition, the present invention allows for mapping a thickness profile of a wafer so that a process operation can use the information to optimize the process variables for the incoming wafer thickness. One skilled in the art will appreciate that the thickness of the wafer can also be monitored upon the completion of the processing operation. For example, after the illustrative CMP operations used above, the thickness of the wafer can be monitored as the wafer is brought back to a load module. The post-process monitoring can be used to provide feedback to further optimize the processing parameters. Alternatively, the post-process monitoring can be used for the next process the wafer is exposed to where the thickness profile of the wafer is helpful information.

Moreover, the eddy current sensor clusters were described as being integrated with aligners in one embodiment of the invention. It should be appreciated that any tool generating full or partial wafer rotation can be effective for generating a thickness profile in conjunction with the sensor clusters. In addition, the sensor clusters can be employed along the wafer path, such that the robot passes the wafer between the sensor cluster or array of sensor clusters. In turn, the thickness profile is detected from the linear radial motion of the wafer between the sensor clusters. Thus, the measurements are performed on the fly at typical robotics loading/unloading velocity. That is, system throughput is not impacted. In one embodiment, the sensitivity of the eddy current sensors may be enhanced as described in application Ser. No. 10/256,055 entitled "Enhancement of Eddy Current Based Measurement Capabilities" filed on Sep. 25, 2002, which is hereby incorporated for all purposes.

The embodiments described herein also provide for a CMP system that is configured to differentially control removal rates being applied to regions of a wafer. The differential control enables for a uniform thickness to be obtained as opposed to a uniform removal rate. Through the use of a fluid restraining device that creates a lake, a uniform slurry layer is defined. The uniform slurry layer is then disturbed as described above in order to apply different removal rates to a surface of a wafer.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A semiconductor processing system, comprising:
    a first sensor array configured to isolate and measure a film thickness signal portion for a wafer having a film disposed over a substrate, the first sensor array having top and bottom sensors wherein each of the top sensors share an axis with a corresponding bottom sensor;
    a second sensor configured to detect a film thickness dependent signal in situ during processing; and
    a controller configured to receive a signal from the first sensor and a signal from the second sensor, the controller capable of determining a calibration coefficient from data represented by the signal from the first sensor, the controller capable of applying the calibration coefficient to data associated with the second sensor, wherein the calibration coefficient substantially eliminates inaccuracies introduced to the film thickness dependent signal from the substrate.

2. The system of claim 1, wherein the first sensor array and the second sensor are eddy current sensors.

3. The system of claim 1, wherein each of the top sensors are out of phase with the corresponding bottom sensor by about 180 degrees.

4. The system of claim 1, wherein the second sensor is further configured to trigger an endpoint of a processing operation based upon obtaining a target processing film state.

5. The system of claim 1, wherein the first sensor array is associated with a wafer aligner station and the second sensor is associated with a chemical mechanical planarization (CMP) module.

6. The system of claim 5, wherein the second sensor is embedded in a wafer carrier of the CMP module.

7. The system of claim 1, wherein the controller is configured to average readings from corresponding top and bottom sensors in order to eliminate consideration of proximity of the top and bottom sensors to the wafer.

8. A metrological monitoring system configured to provide real-time thickness data with minimal inaccuracies, comprising:
- a first group of sensors configured to generate data representing a thickness map associated with a wafer located within a detection region of the first group of sensors, the thickness map generated prior to a processing operation, the first group of sensors including opposing top and bottom sensors wherein each of the top sensors share an axis with a corresponding bottom sensor;
- a second group of sensors configured to detect a thickness at a location on the wafer corresponding to one of the second group of sensors during a processing operation; and
- a computing device in communication with the first group of sensors and the second group of sensors, the computing device enabled to remove inaccuracies introduced into the thickness data at the location from a conductive body through the application of a calibration coefficient determined from the data representing the thickness map.

9. The system of claim 8, wherein the first group of sensors generate the data in conditions with negligible third body effects.

10. The system of claim 8, wherein the first group of sensors and the second group of sensors are eddy current sensors.

11. The system of claim 8, wherein each sensor of the second group of sensors is capable of providing a signal indicating an adjustment to a removal rate applied to a region of the wafer corresponding to the respective sensor.

12. The system of claim 8 wherein the first group of sensors are configured to scan across a surface of the wafer.

13. The system of claim 8, wherein the thickness map includes a substrate contribution and a film contribution.

14. The system of claim 13, wherein the computing device is further configured to isolate the film thickness component from a signal detected by the second group of sensors.

15. The system of claim 8, wherein each of the top sensors are out of phase with the corresponding bottom sensor by about 180 degrees.

16. The system of claim 8, wherein the computing device is configured to average readings from opposing sensors of the second group of sensors in order to eliminate consideration of proximity of the second group of sensors to the wafer.

* * * * *